(12) United States Patent
Hokazono et al.

(10) Patent No.: US 9,755,637 B2
(45) Date of Patent: Sep. 5, 2017

(54) DRIVE CIRCUIT FOR SEMICONDUCTOR ELEMENT AND SEMICONDUCTOR DEVICE

(71) Applicant: Mitsubishi Electric Corporation, Tokyo (JP)

(72) Inventors: Kazuya Hokazono, Tokyo (JP); Akihisa Yamamoto, Tokyo (JP); Dong Wang, Tokyo (JP)

(73) Assignee: Mitsubishi Electric Corporation, Tokyo (JP)

( * ) Notice: Subject to any disclaimer, the term of this patent is extended or adjusted under 35 U.S.C. 154(b) by 16 days.

(21) Appl. No.: 14/785,725

(22) PCT Filed: Jul. 16, 2013

(86) PCT No.: PCT/JP2013/069308
§ 371 (c)(1),
(2) Date: Oct. 20, 2015

(87) PCT Pub. No.: WO2015/008331
PCT Pub. Date: Jan. 22, 2015

(65) Prior Publication Data
US 2016/0118979 A1    Apr. 28, 2016

(51) Int. Cl.
*H03B 1/00* (2006.01)
*H03K 3/00* (2006.01)
(Continued)

(52) U.S. Cl.
CPC ........... *H03K 17/60* (2013.01); *H03K 17/165* (2013.01); *H03K 19/017509* (2013.01);
(Continued)

(58) Field of Classification Search
CPC ............................ H03K 17/60; H03K 17/165
(Continued)

(56) References Cited

U.S. PATENT DOCUMENTS 7,064,603 B2 *  6/2006  Sakata ................. H03K 17/063
                                                              330/10
2005/0088227 A1 * 4/2005  Sakata ................. H03K 17/063
                                                              330/10
(Continued)

FOREIGN PATENT DOCUMENTS

JP          2004120152 A  *  4/2004
JP          2005130355 A  *  5/2005
(Continued)

OTHER PUBLICATIONS

Notification of Transmittal of Translation of the International Preliminary Report on Patentability and Translation of Written Opinion of the International Searching Authority; PCT/JP2013/089308 issued on Jan. 28, 2016.

*Primary Examiner* — Lincoln Donovan
*Assistant Examiner* — Metasebia Retebo
(74) *Attorney, Agent, or Firm* — Studebaker & Brackett PC

(57) ABSTRACT

A primary circuit produces a first on-pulse and a first off-pulse synchronized with a rising edge and a falling edge of an input signal, respectively. A level shift circuit produces a second on-pulse and a second off-pulse formed by shifting the voltage level of the first on-pulse the first off-pulse, respectively. A secondary circuit outputs an output pulse rising and falling in synchronization with the second on-pulse and the second off-pulse, and holds the output when both of the pulses are high. When the reference potential rises, the pulse corresponding to the state of the input signal during the rise of the second potential in the first on-pulse and the first off-pulse is regenerated and one of the second on-pulse and the second off-pulse is thereby made high after the end of the rise of the second reference potential to retransmit the state of the input signal.

16 Claims, 31 Drawing Sheets 3 high-voltage level shift circuit
7 secondary circuit
11 primary circuit
12 dV/dt detection circuit

(51) Int. Cl.
*H03K 17/60* (2006.01)
*H03K 17/16* (2006.01)
*H03K 19/0175* (2006.01)
*H02M 1/00* (2006.01)

(52) U.S. Cl.
CPC ............ *H02M 2001/0038* (2013.01); *H03K 2217/0063* (2013.01); *H03K 2217/0072* (2013.01)

(58) Field of Classification Search
USPC .......................................................... 327/109
See application file for complete search history.

(56) References Cited

U.S. PATENT DOCUMENTS

| | | | | |
|---|---|---|---|---|
| 2007/0210780 | A1* | 9/2007 | Kataoka | H03K 17/162 323/285 |
| 2011/0074485 | A1* | 3/2011 | Yamamoto | H03K 17/168 327/333 |
| 2011/0227626 | A1* | 9/2011 | Sakura | H03K 19/0175 327/333 |
| 2012/0154007 | A1* | 6/2012 | Imanishi | H03K 17/162 327/194 |

FOREIGN PATENT DOCUMENTS

| | | | | |
|---|---|---|---|---|
| JP | 2006319884 | A | * | 11/2006 |
| JP | 2007243254 | A | * | 9/2007 |
| JP | 2009117917 | A | * | 5/2009 |
| JP | 2011193419 | A | * | 9/2011 |
| JP | 2012075267 | A | * | 4/2012 |
| JP | 2012130209 | A | * | 7/2012 |
| WO | WO 2013046898 | | * | 4/2013 |

* cited by examiner 1 input circuit
2 one-shot pulse circuit
3 high-voltage level shift circuit
4 interlock circuit
5 drive circuit 3 high-voltage level shift circuit
7 secondary circuit
11 primary circuit
12 dV/dt detection circuit

Fig. 4
Fig. 4A
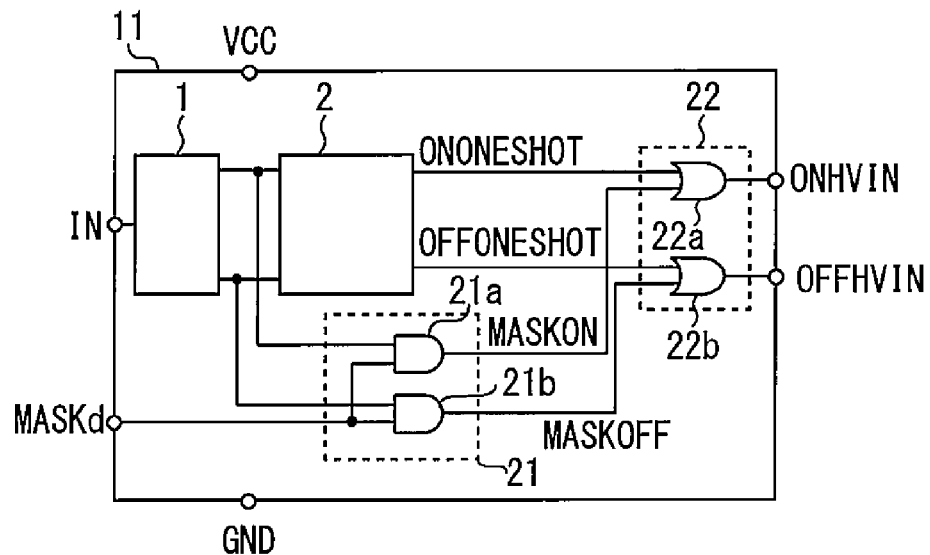
1 input circuit
2 one-shot pulse circuit
Fig. 4B
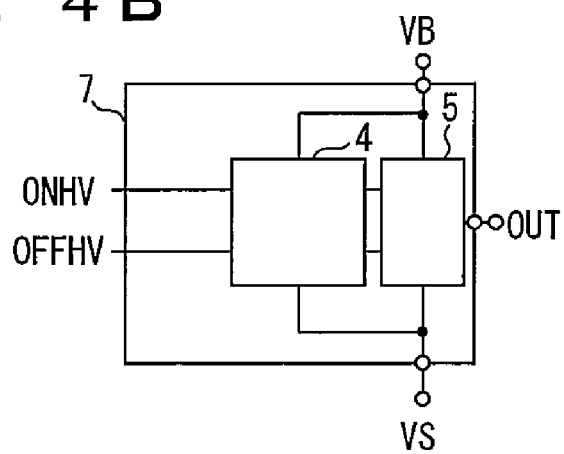
4 interlock circuit
5 drive circuit

37 COMPARATOR 1 input circuit
2 one-shot pulse circuit
21, 22 logic circuit
61 delay circuit 1 input circuit
2 one-shot pulse circuit
21, 22 logic circuit
71 filter circuit 1 input circuit
2 one-shot pulse circuit
21, 22 logic circuit
91 re one-shot pulse circuit 1 input circuit
2 one-shot pulse circuit
21, 22 logic circuit
102 re one-shot pulse circuit (negative edge)

3 high-voltage level shift circuit
122 secondary circuit
11 primary circuit
121 signal transmission circuit 4a interlock circuit
5 drive circuit 3 high-voltage level shift circuit
12 dV/dt detection circuit
122 secondary circuit
127 primary circuit
121 signal transmission circuit 1 input circuit
2 one-shot pulse circuit
21, 22 logic circuit
128 interlock circuit 3 high-voltage level shift circuit
11 primary circuit
121 signal transmission circuit
124 secondary circuit 4a interlock circuit
5 drive circuit
131 delay circuit 3 high-voltage level shift circuit
201 primary circuit
202 secondary circuit
203 signal transmission circuit 4a interlock circuit
5 drive circuit 1 input circuit
2 one-shot pulse circuit
22 logic circuit 3 high-voltage level shift circuit
202 secondary circuit
203 signal transmission circuit
231 primary circuit 1 input circuit
2 one-shot pulse circuit
21, 22 logic circuit
241 interlock circuit

DRIVE CIRCUIT FOR SEMICONDUCTOR ELEMENT AND SEMICONDUCTOR DEVICE

TECHNICAL FIELD

The present invention relates to a drive circuit for a semiconductor element and to a semiconductor device.

BACKGROUND ART

Various techniques for preventing a malfunction in a drive circuit for driving a switching element, including, for example, one disclosed in Japanese Patent Laid-Open No. 2012-75267, are known. The drive circuit in the above-mentioned publication is provided as a high-withstand-voltage IC which supplies a gate drive signal to an insulated gate bipolar transistor (IGBT) functioning as a switching element. The publication also describes use of a level shift circuit as a circuit for driving a switching element on the high potential side.

CITATION LIST

Patent Literature

Patent Literature 1: Japanese Patent Laid-Open No. 2012-75267
Patent Literature 2: Japanese Patent Laid-Open No. 2011-193419
Patent Literature 3: Japanese Patent Laid-Open No. 2006-319884
Patent Literature 4: Japanese Patent Laid-Open No. 2012-130209

SUMMARY OF INVENTION

Technical Problem

As a power switching element called a power semiconductor element, various transistors including IGBTs and power MOSFETs are being used. To drive a switching element used for such power control, a method of producing a signal for driving the switching element by inputting an input signal to a high-voltage level shift circuit is practiced.

As an example of the drive circuit, a circuit is known in which a primary circuit which receives an input signal, a high-voltage level shift circuit and a secondary circuit which outputs a drive signal are connected in series. A primary one-shot pulse synchronized with the rising edge of a pulse provided as an input signal will also be referred to as "on-one-shot pulse." A primary one-shot pulse synchronized with the falling edge of a pulse provided as an input signal will also be referred to as "off-one-shot pulse." The primary circuit is a circuit for producing the on-one-shot pulse and off-one-shot pulse.

A set of primary one-shot pulses formed of the on-one-shot pulse and off-one-shot pulse are level-shifted by the high-voltage level shift circuit. The high-voltage level shift circuit produces a set of secondary one-shot pulses by level-shifting the set of primary one-shot pulses. This set of secondary one-shot pulses is input from the high-voltage level shift circuit to the secondary circuit. The secondary circuit combines the set of secondary one-shot pulses and finally outputs a drive signal formed of a pulse having the same waveform as the input signal and level-shifted.

The set of primary one-shot pulses in the primary circuit are respectively produced in synchronization with the rising edge and the falling edge of the input signal. Therefore, both the set of primary one-shot pulses do not simultaneously become high in an ordinary situation. Similarly, both the set of secondary one-shot pulses do not simultaneously become high in an ordinary situation.

The secondary circuit is connected to a power supply potential VB and to a reference potential VS. In some cases, an interlock circuit is provided on the secondary circuit for the purpose of preventing a malfunction due to a change in reference potential VS. When both the set of secondary one-shot pulses input to the interlock circuit become high simultaneously, the signal is not transmitted to any circuit subsequent to the secondary circuit. The state of both the two pulses simultaneously becoming high is hereinafter expressed by "in-phase" for convenience sake.

The inventor of the present invention found that a problem described below arises with the above-described configuration due to the connection of the high-voltage level shift circuit to the power supply potential VB and to the reference potential VS.

Essentially, the high-voltage level shift circuit outputs one set of secondary one-shot pulses in synchronization with one set of primary one-shot pluses from the primary circuit. On the other hand, in the case where the high-voltage level shift circuit is connected to the power supply potential VB and to the reference potential VS, a malfunction occurs when the reference potential VS rises. That is, when the reference potential VS rises, the high-voltage level shift circuit outputs a set of unnecessary pluses rising during the time period when the reference potential VS rises. This set of unnecessary pulses is also referred to as "in-phase signals."

The rise of the reference potential VS influences the entire output from the high-voltage level shift circuit. The in-phase signals cause both of one set of one-shot pulses transmitted from the high-voltage level shift circuit to the secondary circuit to simultaneously become high and be high during the same time period. If the rise of the reference potential continues for a time period longer than the secondary one-shot pulse width, the in-phase signals caused by the rise of the reference potential VS mask the secondary one-shot pulse having a shorter width, which is a normal signal.

As described above, in-phase signals output from the high-voltage level shift circuit due to a rise of the reference potential VS simultaneously become high and are high during the same time period. As a result, signals in phase with and equal in width to each other are input to the secondary circuit. There is a problem that when such in-phase signals are input, a malfunction of the secondary circuit including the interlock circuit occurs.

The present invention has been achieved to solve the above-described problem, and an object to the present invention is to provide a drive circuit for a semiconductor element and a semiconductor device in which a malfunction of a drive circuit is inhibited.

Solution to Problem

A drive circuit for a semiconductor element, comprising:
a primary circuit which receives an input signal and produces, on the basis of a first reference potential, a first on-pulse synchronized with a rising edge of the input signal and a first off-pulse synchronized with a falling edge of the input signal;
a level shift circuit which produces, on the basis of a second reference potential different from the first reference potential, a second on-pulse formed by shifting the voltage level of the first on-pulse and a second off-pulse formed by shifting the voltage level of the first off-pulse; and a secondary circuit which outputs, as a drive signal for the semiconductor element, an output pulse rising in synchronization with the second on-pulse and falling in synchronization with the second off-pulse, and which holds the output when both the second on-pulse and the second off-pulse are high, wherein when the second reference potential rises, the pulse corresponding to the state of the input signal during the rise of the second potential in the first on-pulse and the first off-pulse is regenerated and one of the second on-pulse and the second off-pulse is thereby made high after the end of the rise of the second reference potential to retransmit the state of the input signal.

A semiconductor device comprising:

a semiconductor switching element having a first terminal, a second terminal, and a control terminal for switching between conduction and shutoff between the first terminal and second terminal;

an input terminal through which an input signal is received; and a drive circuit which receives the input signal and supplies a drive signal to the control terminal, the drive circuit including:

a primary circuit which receives the input signal and produces, on the basis of a first reference potential, a first on-pulse synchronized with a rising edge of the input signal and a first off-pulse synchronized with a falling edge of the input signal;

a level shift circuit which produces, on the basis of a second reference potential different from the first reference potential, a second on-pulse formed by shifting the voltage level of the first on-pulse and a second off-pulse formed by shifting the voltage level of the first off-pulse; and a secondary circuit which outputs, as the drive signal, an output pulse rising in synchronization with the second on-pulse and falling in synchronization with the second off-pulse, and which holds the output when both the second on-pulse and the second off-pulse are high, wherein when the second reference potential rises, the pulse corresponding to the state of the input signal during the rise of the second potential in the first on-pulse and the first off-pulse is regenerated and one of the second on-pulse and the second off-pulse is thereby made high after the end of the rise of the second reference potential to retransmit the state of the input signal.

Advantageous Effects of Invention

According to the present invention, the state of the input signal can be retransmitted, so that a malfunction of the secondary circuit can be inhibited and a malfunction of the drive circuit can be inhibited.

BRIEF DESCRIPTION OF DRAWINGS

FIG. 4 is a circuit diagram showing the configuration of the drive circuit for a semiconductor element according to Embodiment 1 of the present invention.

FIG. 4A is a circuit diagram showing the configuration of the drive circuit for a semiconductor element according to Embodiment 1 of the present invention.

FIG. 4B is a circuit diagram showing the configuration of the drive circuit for a semiconductor element according to Embodiment 1 of the present invention.

FIG. 7A is a circuit diagram showing the configuration of the drive circuit for a semiconductor element according to Embodiment 2 of the present invention.

FIG. 7B is a circuit diagram showing the configuration of the drive circuit for a semiconductor element according to Embodiment 2 of the present invention.

DESCRIPTION OF EMBODIMENTS

Embodiment 1

[Configuration of Device According to Embodiment 1]

Figure 3:
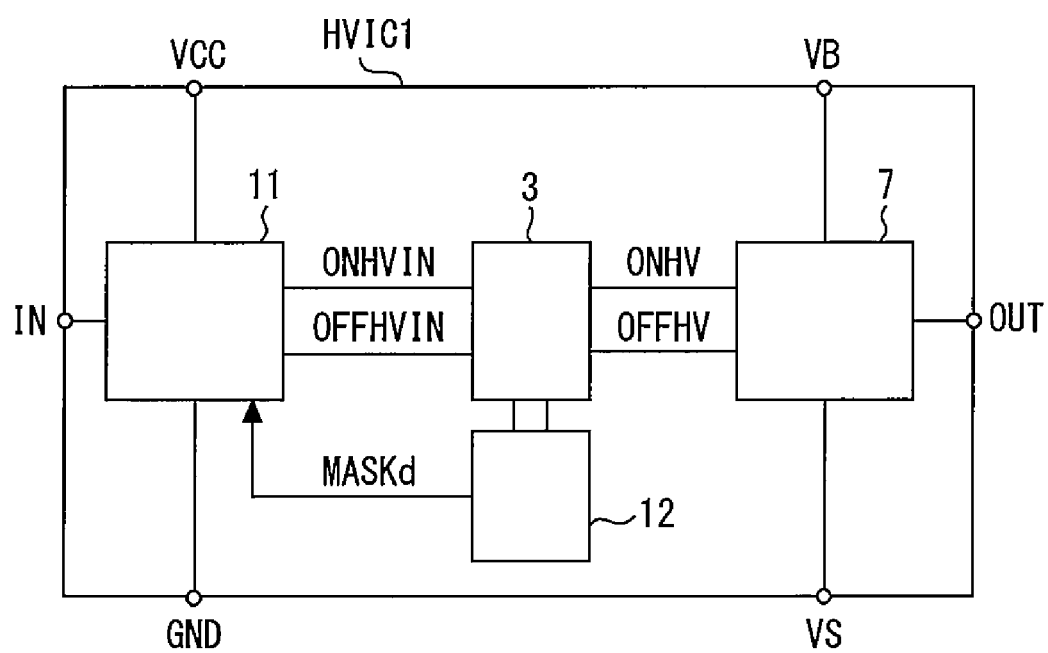
FIG. 3 is a circuit diagram showing a configuration of a drive circuit for a semiconductor element according to Embodiment 1 of the present invention.

FIG. 3 is a circuit diagram showing a configuration of a drive circuit HVIC1 for a semiconductor element according to Embodiment 1 of the present invention. The drive circuit HVIC1 includes a primary circuit 11, a high-voltage level shift circuit 3, a secondary circuit 7, and a dV/dt detection circuit 12. The drive circuit HVIC1 is provided as a so-called high-withstand-voltage integrated circuit (high voltage integrated circuit).

The drive circuit HVIC1 also includes an input terminal through which an input signal IN is received, an output terminal through which a drive signal OUT is output, a first power supply terminal through which a primary power supply VCC is received, a ground terminal connected to a ground potential GND, which is a primary reference potential, a second power supply terminal connected to a secondary power supply VB, and a reference voltage terminal connected to a secondary reference potential VS.

It is assumed that if a circuit block in the following description includes terminals to which VCC and GND or VB and Vs are respectively applied, the power supply VCC or VB is used as a drive power supply for the circuit and GND or VS is used as a reference potential.

The primary circuit 11 is supplied with power from the power supply VCC and is connected to the ground potential GND. The primary circuit 11 receives the input signal IN and produces, on the basis of the first reference potential GND, a pulse signal ONHVIN in synchronization with the rising edge of the input signal IN and a pulse signal OFFHVIN in synchronization with the falling edge of the input signal IN.

The high-voltage level shift circuit 3 is supplied with power from the power supply VB and is connected to the reference potential VS. The high-voltage level shift circuit 3 produces, on the basis of the second reference potential VS, a pulse signal ONHV formed by shifting the voltage level of the pulse signal ONHVIN and a pulse signal OFFHV formed by shifting the voltage level of the pulse signal OFFHVIN.

The secondary circuit 7 is supplied with power from the power supply VB and is connected to the reference potential VS. The secondary circuit 7 outputs a drive signal OUT which rises in synchronization with the pulse signal ONHV and falls in synchronization with the pulse signal OFFHV.

The secondary circuit 7 holds the output when both the pulse signal ONHV and the pulse signal OFFHV are high.

The dV/dt detection circuit 12 produces a mask signal MASKd. The mask signal MASKd is a pulse signal having a width equal to a time period during which the reference potential VS rises. More specifically, the dV/dt detection circuit 12 detects a change in voltage of the reference potential VS and generates, as a mask signal MASKd, a pulse signal which rises in synchronization with the beginning of the rise of the voltage and falls in synchronization with the end of the rise of the voltage.

FIG. 4 is a circuit diagram showing the configuration of the drive circuit HVIC1 for a semiconductor element according to Embodiment 1 of the present invention. FIG. 4A is a circuit diagram showing internal components of the primary circuit 11, and FIG. 4B is a circuit diagram showing internal components of the secondary circuit 7.

As shown in FIG. 4A, the primary circuit 11 includes an input circuit 1 which receives the input signal IN, a one-shot pulse circuit 2, a logic circuit 21, and a logic circuit 22. The input circuit 1 is connected to the one-shot pulse circuit 2 by two wiring lines. A pulse waveform identical to the input signal IN is transmitted through one of the two wiring lines, while a pulse waveform formed by inverting the input signal IN is transmitted through the other wiring line. The one-shot pulse circuit 2 is connected to the logic circuit 22 by two wiring lines. A one-shot pulse ONONESHOT is transmitted through one of the two wiring lines, while a one-shot pulse OFFONESHOT is transmitted through the other wiring line.

The logic circuit 21 includes two AND circuits 21a and 21b, as shown in the diagram. At the input side of the logic circuit 21, the mask signal MASKd is input and the logic circuit 21 is connected to two wiring lines between the input circuit 1 and the one-shot pulse circuit 2. The logic circuit 21 produces an output as a re-operating signal MASKON, which is the result of computation with the AND circuit 21a of the logical product (AND) of the "pulse waveform identical to the input signal IN" and the "mask signal MASKd." The logic circuit 21 also produces an output as a re-operating signal MASKOFF, which is the result of computation with the AND circuit 21b of the logical product (AND) of the "pulse waveform formed by inverting the input signal IN" and the "mask signal MASKd."

Each of the re-operating signals MASKON and MASKOFF includes a delay time due to, for example, the computation in the logic circuit 21. As a result, each of the re-operating signals MASKON and MASKOFF falls with a delay corresponding to the delay time from the mask signal MASKd.

Four signals are input to the logic circuit 22 at the input side. More specifically, the one-shot pulses ONONESHOT and OFFONESHOT from the one-shot pulse circuit 2 and the re-operating signals MASKON and MASKOFF from the logic circuit 21 are input to the logic circuit 22.

The logic circuit 22 includes two OR circuits 22a and 22b, as shown in the diagram. The logic circuit 22 produces an output as a pulse signal ONHVIN, which is the result of computation with the OR circuit 22a of the logical sum (OR) of the one-shot pulse ONONESHOT and the re-operating signal MASKON. The logic circuit 22 also produces an output as a pulse signal OFFHVIN, which is the result of computation with the OR circuit 22b of the logical sum (OR) of the one-shot pulse OFFONESHOT and the re-operating signal MASKOFF.

In some of the diagrams of the logic circuits 21 and 22 referred to below, each logic circuit is shown only in block form for convenience sake. Each logic circuit, however, has the same internal configuration as that shown in FIG. 4A.

As shown in FIG. 4B, the secondary circuit 7 includes an interlock circuit 4 and a drive circuit 5. The secondary circuit 7 causes the drive signal OUT to rise when the pulse signal ONHV is high and, simultaneously, the pulse signal OFFHV is low. The secondary circuit 7 causes the drive signal OUT to fall when the pulse signal OFFHV is high and, simultaneously, the pulse signal ONHV is low. Thus, the drive signal OUT that rises in synchronization with the pulse signal ONHV and falls in synchronization with the pulse signal OFFHV is output.

The secondary circuit 7 is connected to the power supply potential VB and to the reference potential VS. The interlock circuit 4 is provided in the secondary circuit 7 to prevent a malfunction due to a change in the reference voltage VS. The signals from the series circuit of the interlock circuit 4 and the drive circuit 5 are not transmitted to a circuit in a stage subsequent to the secondary circuit 7 when both the pulse signals ONHV and OFFHV from the high-voltage level shift circuit 3 simultaneously become high.

Figure 6:
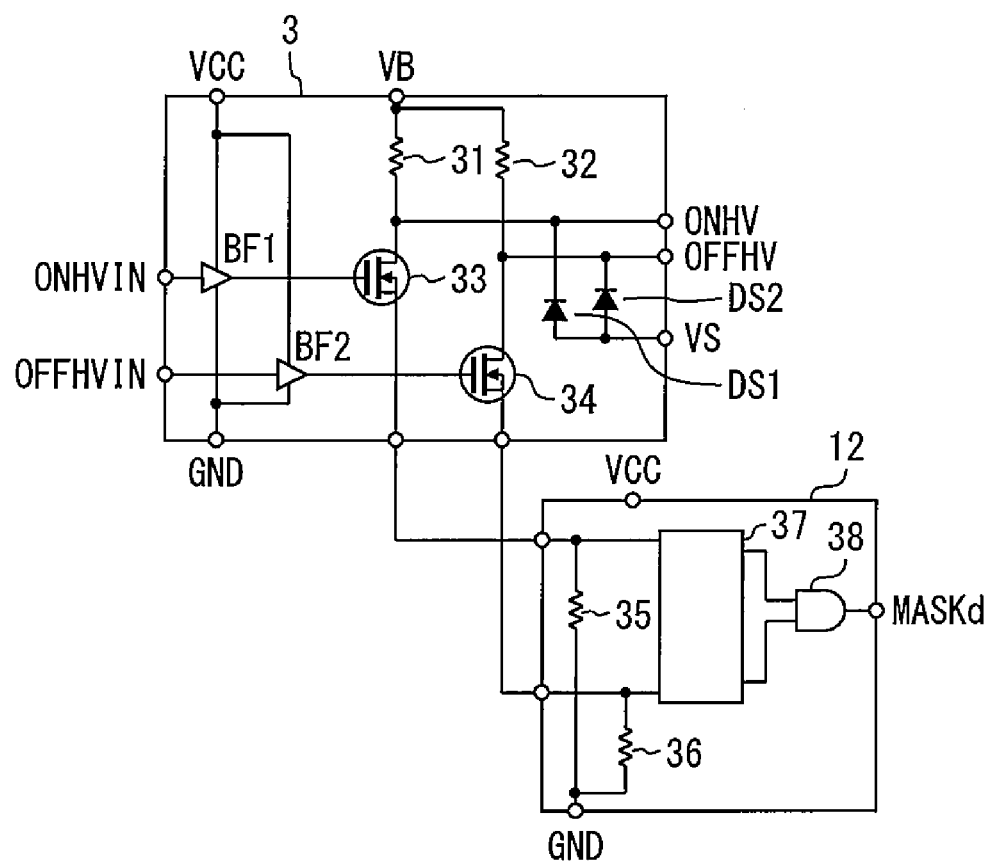
FIG. 6 is a circuit diagram showing the configuration of the drive circuit for a semiconductor element according to Embodiment 1 of the present invention.

FIG. 6 is a circuit diagram showing the configuration of the drive circuit HVIC1 for a semiconductor element according to Embodiment 1 of the present invention. FIG. 6 is a circuit diagram showing a concrete example of the high-voltage level shift circuit 3 and the dV/dt detection circuit 12. The high-voltage level shift circuit 3 includes n-channel high-withstand-voltage NMOSFETs 33 and 34.

The pulse signal ONHVIN is input to the gate of the high-withstand-voltage NMOSFET 33 through a buffer BF1. The pulse signal OFFHVIN is input to the gate of the high-withstand-voltage NMOSFET 34 through a buffer BF2. Each of the buffers BF1 and BF2 is connected to the power supply VCC and the ground potential GND. The power supply VB is connected to the drain of the high-withstand-voltage NMOSFET 33 through a resistor 31 and is also connected to the drain of the high-withstand-voltage NMOSFET 34 through a resistor 32.

The pulse signal ONHV is output from an intermediate point between the resistor 31 and the drain of the high-withstand-voltage NMOSFET 33. The pulse signal OFFHV is output from an intermediate point between the resistor 32 and the drain of the high-withstand-voltage NMOSFET 34. The intermediate point between the resistor 31 and the drain of the high-withstand-voltage NMOSFET 33 is connected to the cathode of a diode DS1. The intermediate point between the resistor 32 and the drain of the high-withstand-voltage NMOSFET 34 is connected to the cathode of a diode DS2. The anodes of the diodes DS1 and DS2 are connected to the reference potential VS.

The dV/dt detection circuit 12 has resistors 35 and 36, a comparator 37 and an AND circuit 38 as its internal components. Each of the sources of the high-withstand-voltage NMOSFETs 33 and 34 is connected to the comparator 37. The comparator 37 is connected to the AND circuit 38 by two wiring lines. An output from the AND circuit 38 is the mask signal MASKd.

With the resistors 35 and 36 inserted between the sources of the high-withstand-voltage NMOSFETs 33 and 34 and GND, the source potentials on the high-withstand-voltage NMOSFETs 33 and 34 are monitored. The comparator 37 compares each of the monitored source potentials with a reference potential Vref.

More specifically, the comparator 37 issues a first output, which is the result of comparison of the source potential on the high-withstand-voltage NMOSFET 33 with the reference potential Vref, to the AND circuit 38. The comparator 37 issues a second output, which is the result of comparison of the source potential on the high-withstand-voltage NMOSFET 34 with the reference potential Vref, to the AND circuit 38. The AND circuit 38 computes the logical product of the first output and the second output.

As a result of taking the logical product with the AND circuit 38, the mask signal MASKd becomes high when each of the source potentials on the high-withstand-voltage NMOSFETs 33 and 34 is high. Also, the mask signal MASKd is low when at least one of the source potentials on the high-withstand-voltage NMOSFETs 33 and 34 is low. Thus, the mask signal MASKd can be generated when in-phase signals are generated in the high-voltage level shift circuit 3.

[Latch Malfunction Problem]

Figure 1:
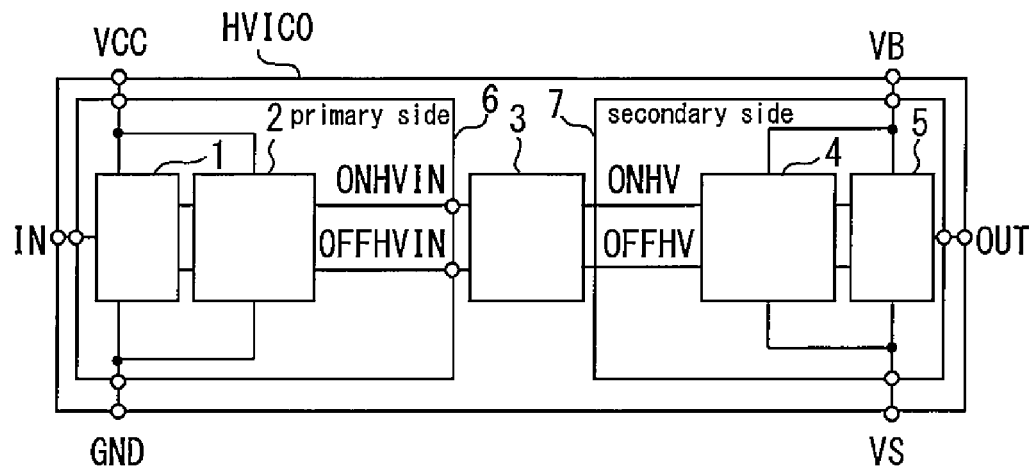
FIG. 1 is a circuit diagram showing a configuration of a drive circuit which is a drive circuit for a semiconductor element according to an art related to the embodiment of the present invention.

The latch malfunction problem to be solved by the drive circuit HVIC1 for a semiconductor element according to Embodiment 1 of the present invention will be described below with reference to FIGS. 1 and 2. FIG. 1 is a circuit diagram showing a configuration of a drive circuit HVIC0 which is a drive circuit for a semiconductor element according to an art related to the embodiment of the present invention.

The drive circuit HVIC0 according to the related art has the same configuration as that of the drive circuit HVIC1 according to Embodiment 1, except that it has the primary circuit 6 in place of the primary circuit 11, and that it does not have the dV/dt detection circuit 12. The primary circuit 6 has the same configuration as that of the primary circuit 11, except that it does not have the logic circuits 21 and 22.

Figure 2:
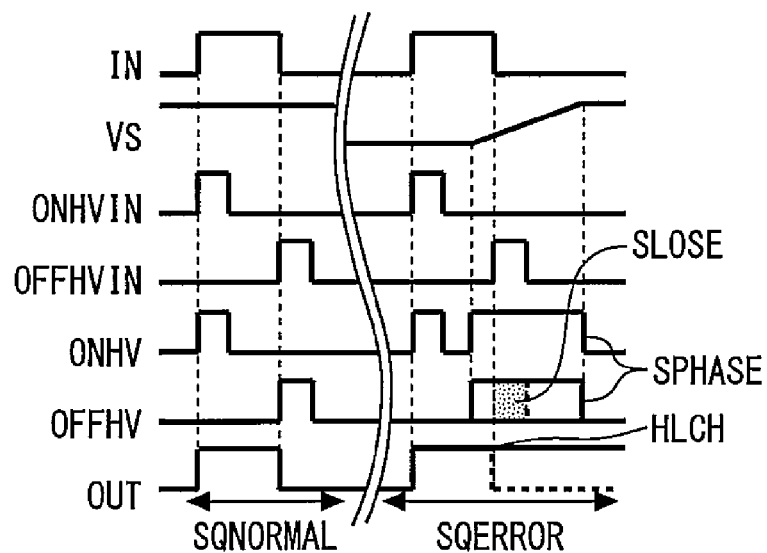
FIG. 2 is a time chart showing the operation of the drive circuit for a semiconductor element according to the art related to the embodiment of the present invention.

FIG. 2 is a time chart showing the operation of the drive circuit HVIC0 for a semiconductor element according to the art related to the embodiment of the present invention. The one-shot pulse circuit 2 produces one set of one-shot pulses through which the input signal IN is transmitted. The one set of one-shot pulses are output as pulse signals ONHVIN and OFFHVIN from the primary circuit 6.

In a normal sequence interval SQNORMAL shown in FIG. 2, a steady state appears after the completion of a rise of the potential VS, where the input signal IN is normally level-shifted and the rising edge and the falling edge of the drive signal OUT are correctly produced.

On the other hand, in a case where the reference potential VS rise period is longer than the pulse width of the pulse signals ONHVIN and OFFHVIN, a malfunction occurs in an abnormal sequence interval SQERROR shown in FIG. 2. This malfunction will be described. First, a rise of the reference potential VS occurs. Changes in reference potential VS include a change due to noise as well as a change accompanying turning-on of the switching element driven by the drive circuit HVIC0.

In general, the reference potential VS and the power supply VB are produced in combination with each other. The difference between these potentials is constantly maintained. When the reference potential VS rises, the power supply VB also rises. Due to this relationship between the reference potential VS and the power supply VB, unnecessary pulse signals rise in the high-voltage level shift circuit 3 connected to the reference potential VS and the power supply VB, which unnecessary pulse signals are shown as in-phase signals SPHASE shown in FIG. 2, and are input to the interlock circuit 4. The in-phase signals SPHASE rise at the beginning of the rise of the reference potential VS and fall at the end of the rise of the reference potential VS.

Essentially, only the pulse signals ONHV and OFFHV are to be input to the interlock circuit 4 when the pulse signals ONHVIN and OFFHVIN from the primary circuit 6 are level-shifted. The in-phase signals SPHASE, however, mask the pulse signal ONHV or OFFHV. A shut-off signal SLOSE shown in FIG. 2 represents such a state. The shut-off signal SLOSE is a signal disappearing due to an overlap between the pulse signal OFFHV formed by level-shifting the pulse signal OFFHVIN and the in-phase signal SPHASE.

The in-phase signals SPHASE rise simultaneously and fall simultaneously on the two wiring lines connecting the high-voltage level shift circuit 3 and the secondary circuit 7. The interlock circuit 4 has the function of stopping such in-phase signals from passing to the subsequent stage when receiving the in-phase signals.

In the abnormal sequence interval SQERROR shown in FIG. 2, therefore, the interlock circuit 4 operates to stop the input signal IN from transmitting to the drive circuit 5. More specifically, the drive signal OUT having risen high is held high without falling at the time (HLCH in FIG. 2) at which the drive signal OUT is to fall normally. This is the "latch malfunction" considered a problem relating to the present embodiment.

[Operation of the Device According to Embodiment 1]

Figure 5:
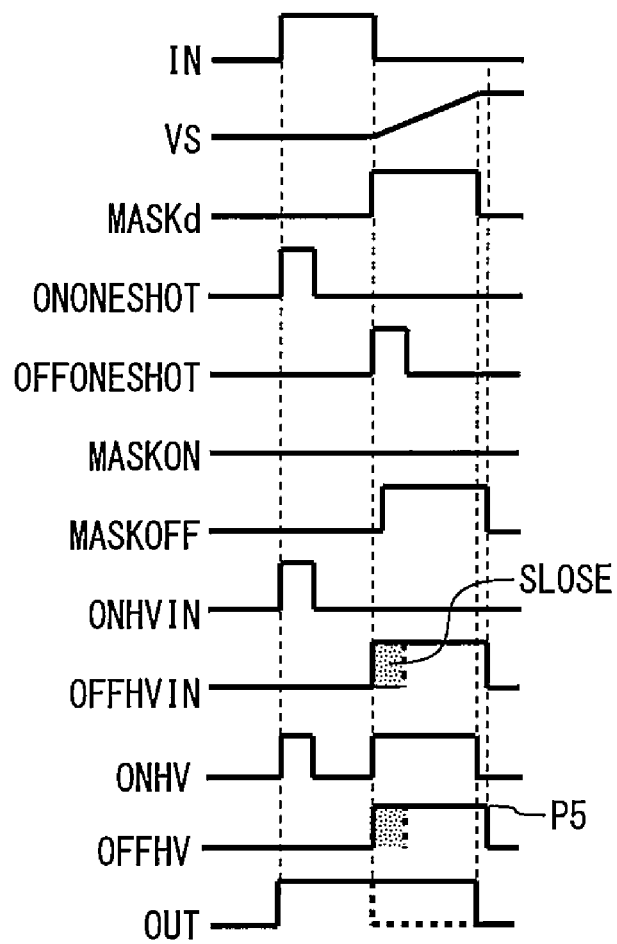
FIG. 5 is a time chart showing the operation of the drive circuit for a semiconductor element according to Embodiment 1 of the present invention.

The drive circuit HVIC1 according to Embodiment 1 is capable of solving the above-described "latch malfunction" problem. FIG. 5 is a time chart showing the operation of the drive circuit HVIC1 for a semiconductor element according to Embodiment 1 of the present invention.

In the drive circuit HVIC1, the mask signal MASKd is produced according to a rise of the reference potential VS and is input to the primary circuit 11. The logic circuit 21 computes the logical product (AND) of the input signal IN and the mask signal MASKd to produce the re-operating signals MASKON and MASKOFF.

The logic circuit 22 computes the logical sum (OR) of the one-shot pulses ONONESHOT and OFFONESHOT and the re-operating signals MASKON and MASKOFF, thereby combining these signals. The pulse signals ONHVIN and OFFHVIN as a result of this combining are input to the high-voltage level shift circuit 3. The high-voltage level shift circuit 3 level-shifts these signals.

In the drive circuit HVIC0 according to the related art, as described above with reference to FIGS. 1 and 2, the occurrence of a rise of the reference potential VS results in the generation of pulses (in-phase signals SPHASE) rising only in the reference potential VS rise period in the outputs from the high-voltage level shift circuit 3. The same occurs in the drive circuit HVIC1 according to Embodiment 1.

In the drive circuit HVIC1 according to Embodiment 1, however, the logic circuit 22 combines one of the re-operating signals MASKON and MASKOFF with the output from the one-shot pulse circuit 2 according to the relationship between the input signal IN and reference potential VS rise times.

The output operation of the logic circuit 21 shown in FIG. 5 will be described. First, referring to FIG. 5, the mask signal MASKd is high during the time period when the input signal IN is low. In this case, the logical product of the "pulse waveform identical to the input signal IN" and the "mask signal MASKd" is low. Therefore, the re-operating signal MASKON does not rise.

On the other hand, referring to FIG. 5, the mask signal MASKd is high during the time period when the input signal IN is low, i.e., the time period when the inverted signal of the input signal IN is high. Accordingly, the logical product of the "pulse waveform formed by inverting the input signal IN" and the "mask signal MASKd" is high and the re-operating signal MASKOFF rises with a certain delay. Thus, only the re-operating signal MASKOFF is produced when the rise waveforms of the input signal IN and the reference potential VS exist as shown in FIG. 5.

The pulse signal OFFHVIN combined from the re-operating signal MASKOFF is level-shifted by the high-voltage level shift circuit 3 to form the pulse signal OFFHV. The falling edge of the pulse signal OFFHV occurs with a delay from that of the in-phase signals SPHASE accompanying the rise of the reference potential VS.

This "delay of the falling edge" will be described in more detail. The in-phase signals SPHASE accompanying the rise of the reference potential VS can be regarded as having the same width as that of the mask signal MASKd. Since the re-operating signal MASKOFF is originally a signal formed by delaying the mask signal MASKd, the falling edge of the re-operating signal MASKOFF is necessarily delayed relative to the falling edge of the mask signal MASKd. As a result, the falling edge of the pulse signal OFFHV containing the re-operating signal MASKOFF is delayed relative to the falling edge of the mask signal MASKd (i.e., the falling edges of the in-phase signals SPHASE).

In the drive circuit HVIC1 according to the present embodiment, when the reference potential VS rises, one of the pulse signals ONHVIN and OFFHVIN corresponding to the state of the input signal during the rise of the reference potential VS can be made high after the completion of the rise of the reference potential VS, as described above. More specifically, one of the pulse signals ONHVIN and OFFHVIN corresponding to the state of the input signal during the rise of the reference potential VS can be caused to fall in synchronization with the falling edge of the re-operating signal MASKON or MASKOFF.

By this operation, in the event of generation of the in-phase signals SPHASE, one of the pulse signals ONHV and OFFHV input to the secondary circuit 7 can be made high after the completion of the rise of the reference potential VS. In the case shown in FIG. 5, the pulse signal OFFHV can be made high after the completion of the rise of the reference potential VS by delaying the falling edge of the pulse signal OFFHV.

A state where the pulse signal ONHV is low and the pulse signal OFFHV is high can thereby be brought about, as indicated at P5 in FIG. 5. This is contrastive to the state in FIG. 2 where the falling edges of the in-phase signals SPHASE are simultaneous.

If the time period during which the pulse signal ONHV is low and the pulse signal OFFHV is high can be created, the operation in which the interlock circuit 4 does not operate and in which the drive signal OUT is caused to fall in the secondary circuit 7 can be normally performed. The operation in which the drive signal OUT is fixed high can thereby be avoided, that is, the latch malfunction can be avoided.

A case where a reference potential VS rise period occurs in the time period during which the input signal IN is low has been described with reference to the time chart of FIG. 5. In the drive circuit HVIC1 according to Embodiment 1, however, the latch malfunction can also be avoided in a case where a reference potential VS rise period occurs in the time period during which the input signal IN is high.

In a case where a reference potential VS rise period occurs in the time period during which the input signal IN is high, only the re-operating signal MASKON is produced and the re-operating signal MASKOFF is not produced. In this case, the re-operating signal MASKON plays the same role as the re-operating signal MASKOFF in the case shown in FIG. 5 and the falling edge of the pulse signal ONHV can be delayed. A time period during which the pulse signal ONHV is high and the pulse signal OFFHV is low can thereby be created when the reference potential VS rises.

For the present embodiment, the case where the re-operating signal MASKOFF is generated is shown in the time chart by way of example, while the case where the re-operating signal MASKON is generated is omitted. However, the same operation as that described with respect to Embodiment 1 can also be performed in the case where the re-operating signal MASKON is generated. The same applies to the following Embodiments 2 to 18 described below in which time charts will be used.

In the time charts used for the embodiments described below, the waveforms of the pulse signals ONHV and OFFHV are omitted as appropriate. The waveforms of the pulse signals ONHV and OFFHV are shown in the time charts as occasion demands. The pulse signal ONHV is a signal formed by shifting the voltage level of the pulse signal ONHVIN, and the pulse signal OFFHV is a signal formed by shifting the voltage level of the pulse signal OFFHVIN, as described above. When the reference potential VS rises, both the pulse signals ONHV and OFFHV rise simultaneously for the same time period only during the rise reference potential VS time period. That is, in-phase signals are generated. The same applies to Embodiment 2 and other subsequent embodiments and, therefore, illustration of the waveforms of the pulse signals ONHV and OFFHV on the time charts is omitted as appropriate.

In Embodiment 1, as described above, the state of the input signal can be retransmitted after the completion of a rise of the reference potential VS. Therefore, the latch malfunction of the secondary circuit 7 can be avoided and a malfunction of the drive circuit HVIC1 can be inhibited.

Embodiment 2

A drive circuit for a semiconductor element according to Embodiment 2 has the same circuit configuration as that of the drive circuit HVIC1 according to Embodiment 1 except that the primary circuit 11 is replaced with a primary circuit 11*a*. In the following description, therefore, components identical or corresponding to those in Embodiment 1 are assigned the same reference characters for description of them; the configuration is described mainly with respect to points of difference from that of Embodiment 1; and the descriptions of commonalities with Embodiment 1, for example, in terms of circuit configuration and circuit operation are simplified or omitted.

The drive circuit for a semiconductor element according to Embodiment 2 produces the re-operating signals MASKON and MASKOFF only when one of the one-shot pulses ONONESHOT and OFFONESHOT overlaps with the mask signal MASKd. "Overlap" between the mask signal MASKd and the one-shot pulse ONONESHOT or OFFONESHOT refers to concurrence of at least portions of the signal and the pulse. An effect of enabling suppressing of the generation of heat accompanying the circuit operation by inhibiting an unnecessary operation of the internal circuits is thus achieved.

Figure 7:
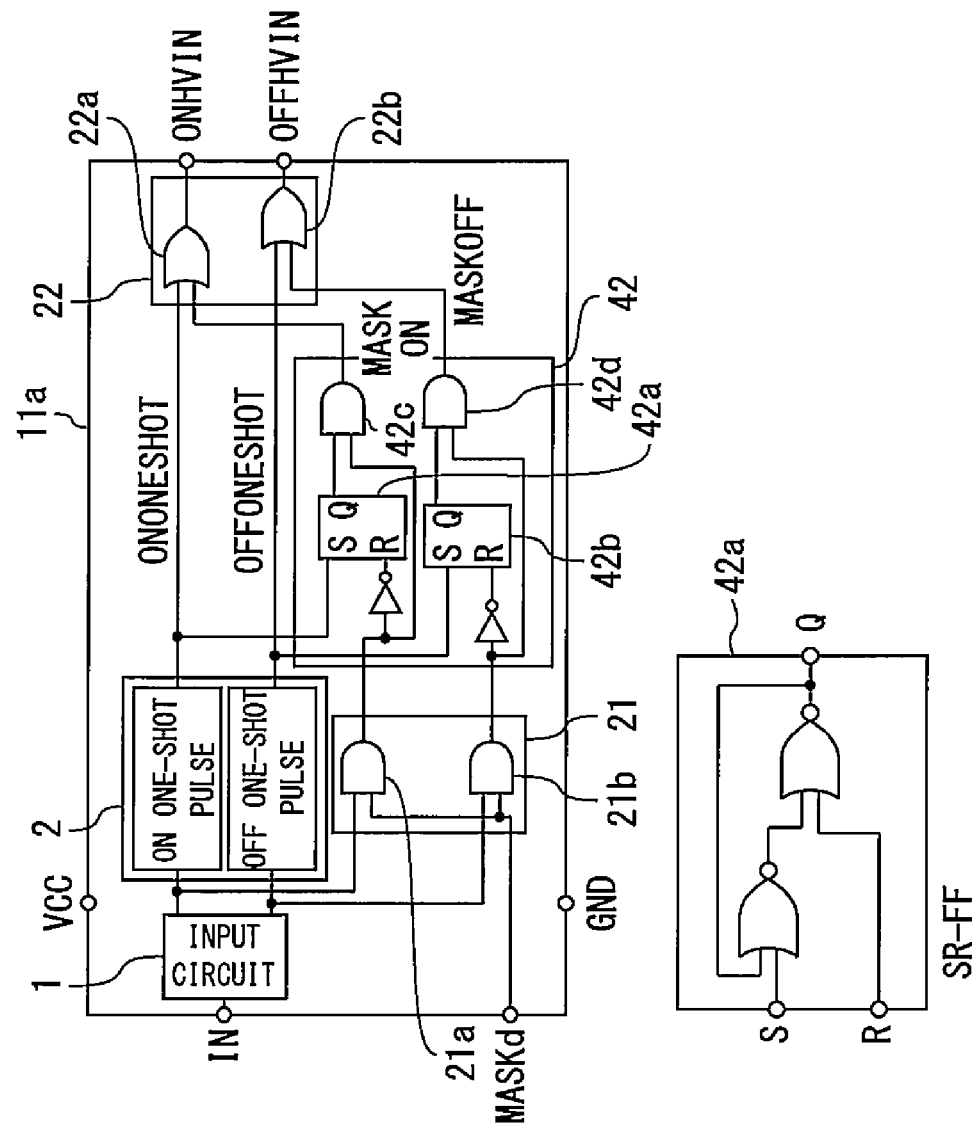
FIG. 7 is a circuit diagram showing the configuration of the drive circuit for a semiconductor element according to Embodiment 2 of the present invention.

FIG. 7 is a circuit diagram showing the configuration of the drive circuit for a semiconductor element according to Embodiment 2 of the present invention. FIG. 7A shows only the primary circuit 11*a* whose configuration is different from that in the drive circuit HVIC1 in Embodiment 1. The primary circuit 11*a* includes logic circuits 21 and 42. The logic circuits 21 and 42 compare the mask signal MASKd and the one-shot pulse signal ONONESHOT or OFFONE- SHOT and generate the re-operating signal MASKON or MASKOFF only when the both are high.

The logic circuit 21 computes the logical product (AND) of the mask signal MASKs and the output signal from the input circuit 1 and outputs the logical product to the logic circuit 42. The logic circuit 42 generates the re-operating signal MASKON or MASKOFF to the high-voltage level shift circuit 3 only when the mask signal MASKd and the one-shot pulse ONONESHOT or OFFONESHOT overlap each other.

As shown in FIG. 7A, the logic circuit 42 includes an SR flip flop (SR-FF) circuit 42a and an SR-FF circuit 42b. The SR-FF circuit 42a and 42b include a NOT circuit in the previous stage and an AND circuit in the subsequent stage, respectively. In FIG. 7, the internal circuit configuration of the one-shot pulse circuit 2 is shown in detail and an "ON one-shot pulse circuit" and an "OFF one-shot pulse circuit" are shown as separate blocks for ease of description. However, each block representing the one-shot pulse circuit 2 in the accompanying drawings is assumed to incorporate the same "ON one-shot pulse circuit" and "OFF one-shot pulse circuit" as those shown in FIG. 7.

The circuit configuration on the SR-FF circuit 42a side will be described. First, the one-shot pulse ONONESHOT is input to a set terminal S, and a single formed by inverting the output from the AND circuit 21a with a NOT circuit is input to a reset terminal R. Also, outputs from an output terminal Q of the SR-FF circuit 42a and the AND circuit 21a are input to the AND circuit 42c, and the logical product of them is output as re-operating signal MASKON.

The circuit configuration on the SR-FF circuit 42b side will be described. First, the one-shot pulse OFFONESHOT is input to a set terminal S, and a single formed by inverting the output from the AND circuit 21b with a NOT circuit is input to a reset terminal R. Also, outputs from an output terminal Q of the SR-FF circuit 42b and the AND circuit 21b are input to an AND circuit 42d, and the logical product of them is output as re-operating signal MASKOFF.

FIG. 7B shows an example of the SR-FF circuit. The logic circuits 21 and 42 may be provided in the reverse order.

Figure 8:
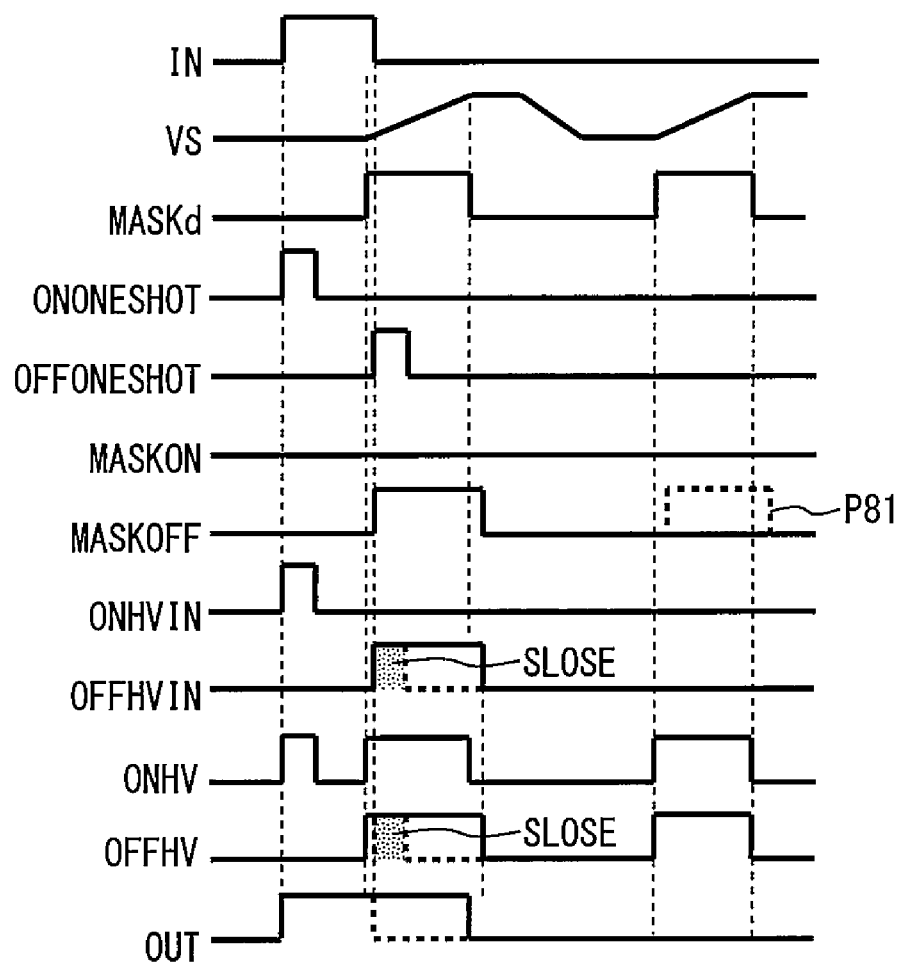
FIG. 8 is a time chart showing the operation of the drive circuit for a semiconductor element according to Embodiment 2 of the present invention.

FIG. 8 is a time chart showing the operation of the drive circuit for a semiconductor element according to Embodiment 2 of the present invention. When both the mask signal MASKd and the one-shot pulse OFFONESHOT are high, the re-operating signal MASKOFF is produced. On the other hand, when the one-shot pulse OFFONESHOT is held low while the mask signal MASKd is high, a pulse P81 indicated by a broken line is not produced. With the one-shot pulse ONONESHOT, the same circuit operation as that with the one-shot pulse OFFONESHOT is also performed.

In Embodiment 2 described above, the re-operating signal MASKON or MASKOFF is not produced when the one-shot pulse ONONESHOT or OFFONESHOT and the mask signal MASKd do not overlap each other. The high-voltage level shift circuit 3 can thereby be prevented from operating unnecessarily by the re-operating signal MASKON or MASKOFF, thus enabling suppressing of the generation of heat accompanying the unnecessary circuit operation.

In Embodiment 2 as well as in Embodiment 1, when the reference potential VS rises, one of the pulse signals ONHVIN and OFFHVIN corresponding to the state of the input signal during the rise of the reference potential VS can be made high after the completion of the rise of the reference potential VS.

Embodiment 3

A drive circuit for a semiconductor element according to Embodiment 3 has the same circuit configuration as that of the drive circuit HVIC1 according to Embodiment 1 except that the primary circuit 11 is replaced with a primary circuit 11b. In the following description, therefore, components identical or corresponding to those in Embodiment 1 are assigned the same reference characters for description of them; the configuration is described mainly with respect to points of difference from that of Embodiment 1; and the descriptions of commonalities with Embodiment 1, for example, in terms of circuit configuration and circuit operation are simplified or omitted.

When the mask signal MASKd fully overlaps the one-shot pulse ONONESHOT or OFFONESHOT, the input signal is not transmitted to the drive circuit 5 at all. In Embodiment 3, the re-operating signal MASKON or MASKOFF is generated only in such a case, thus producing an effect of inhibiting an unnecessary operation of the internal circuits so that the generation of heat accompanying the circuit operation can be suppressed.

Figure 9:
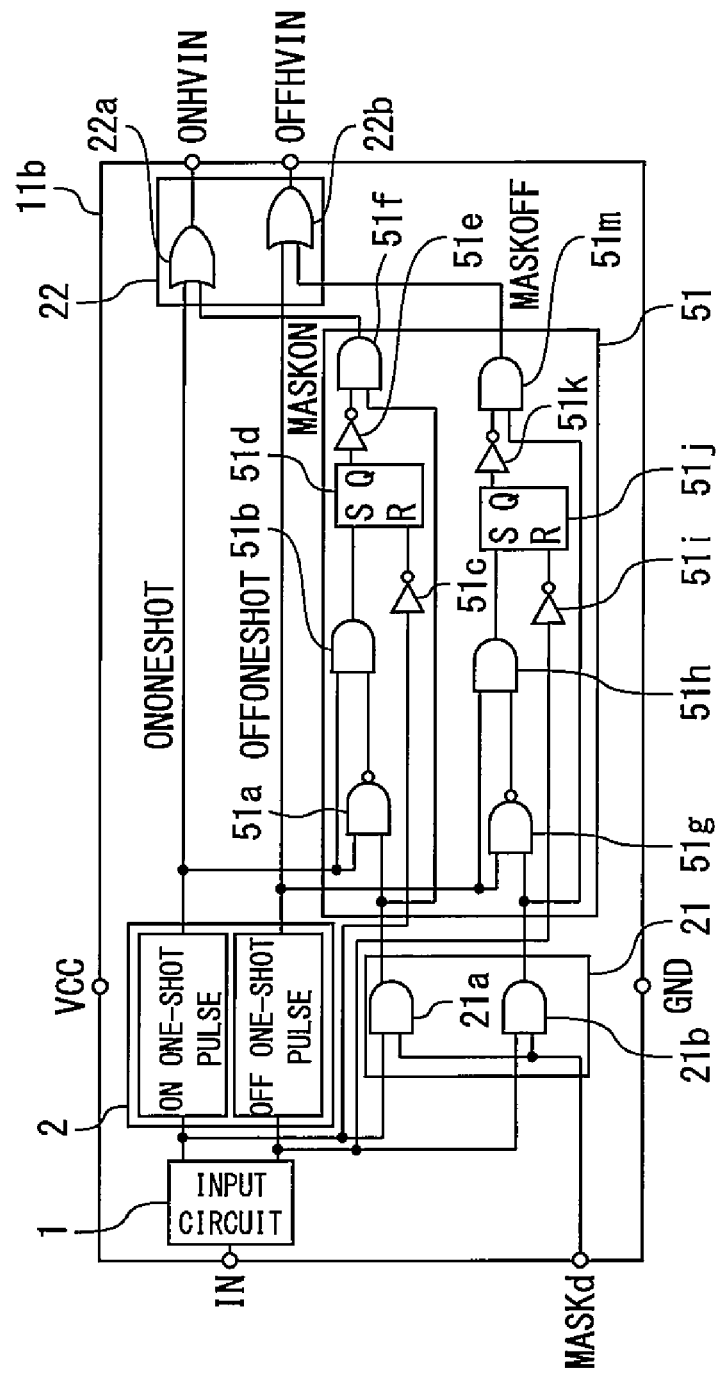
FIG. 9 is a circuit diagram showing the configuration of the drive circuit for a semiconductor element according to Embodiment 3 of the present invention.

FIG. 9 is a circuit diagram showing the configuration of the drive circuit for a semiconductor element according to Embodiment 3 of the present invention. FIG. 9 shows only the primary circuit 11b, which differs from the corresponding component of the drive circuit HVIC1 in Embodiment 1. The primary circuit 11b has a logic circuit 51 provided in place of the logic circuit 42 in the primary circuit 11a.

The primary circuit 11b compares the mask signal MASKd and the one-shot pulses ONONESHOT and OFFONESHOT. Only when the result of comparison is such that the mask signal MASKd detected with the dV/dt detection circuit 12 fully overlaps the one-shot pulse ONONESHOT or OFFONESHOT, the primary circuit 11b generates the re-operating signal MASKON or MASKOFF to the high-voltage level shift circuit 3.

To the logic circuit 51, two outputs from the logic circuit 21, two outputs from the input circuit and two outputs from the one-shot pulse circuit 2 are input. More specifically, as shown in FIG. 9, the logic circuit 51 includes two SR-FF circuits 51d and 51j, as does the logic circuit 42. The difference from the logic circuit 42 resides in that signals are also input from the input circuit 1.

The circuit on the SR-FF circuit 51d side will be described. First, an output from an AND circuit 51b is input to a set terminal S. The one-shot pulse ONONESHOT and an output from a NAND circuit 51a are input to the AND circuit 51b. The one-shot pulse ONONESHOT and the output from the AND circuit 21a are input to the NAND circuit 51a. A signal formed by inverting one of the outputs from the input circuit 1 with a NOT circuit 51c is input to a reset terminal R of the SR-FF circuit 51d. One of the outputs referred to here is the same pulse signal as the input signal IN. An output terminal Q of the SR-FF circuit 51d is input to an AND circuit 51f through a NOT circuit 51e. The output from the AND circuit 21a is also input to the AND circuit 51f. An output from the AND circuit 51f is the re-operating signal MASKON.

The circuit on the SR-FF circuit 51j side will be described. First, an output from an AND circuit 51h is input to a set terminal S. The one-shot pulse OFFONESHOT and an output from a NAND circuit 51g are input to the AND circuit 51h. The one-shot pulse OFFONESHOT and the output from the AND circuit 21b are input to the NAND circuit 51g. A signal formed by inverting the other output from the input circuit 1 with a NOT circuit 51i is input to a reset terminal R of the SR-FF circuit 51j. The other output referred to here is the pulse signal formed by inverting the input signal IN. An output from an output terminal Q of the SR-FF circuit 51j is input to an AND circuit 51m through a NOT circuit 51*k*. The output from the AND circuit 21*b* is also input to the AND circuit 51*m*. An output from the AND circuit 51*m* is the re-operating signal MASKOFF.

Figure 10:
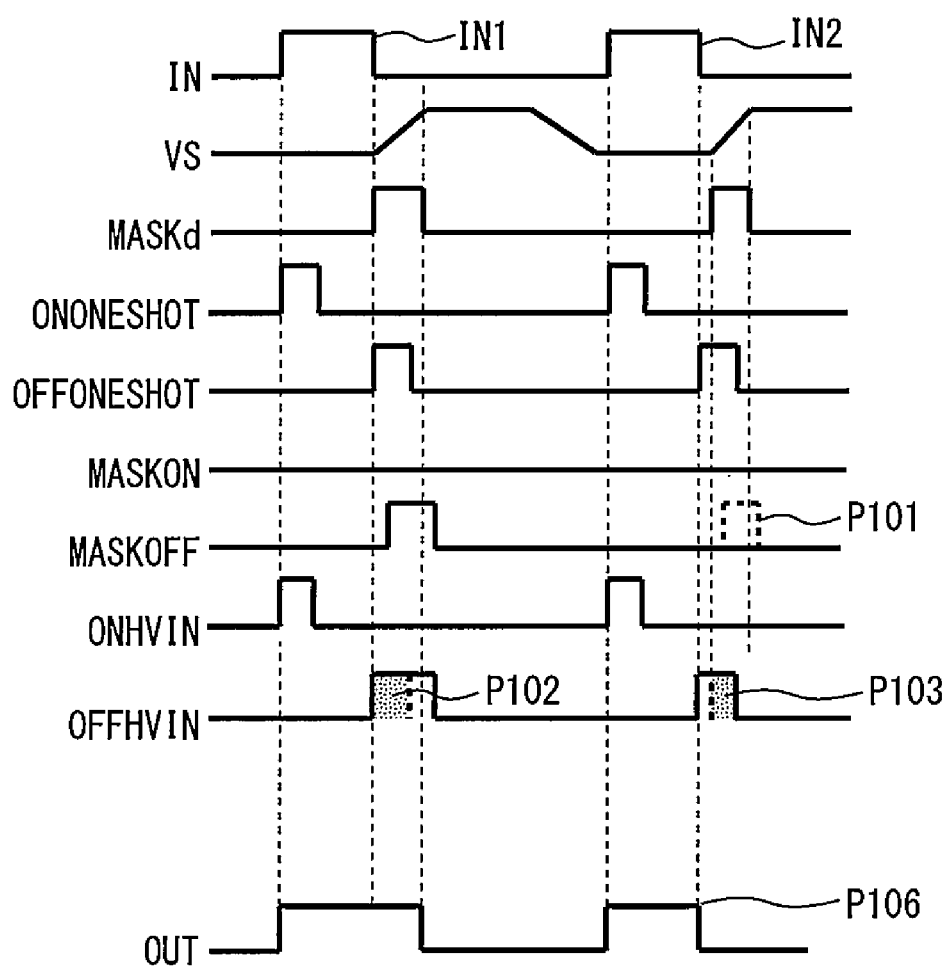
FIG. 10 is a time chart showing the operation of the drive circuit for a semiconductor element according to Embodiment 3 of the present invention.

FIG. 10 is a time chart showing the operation of the drive circuit for a semiconductor element according to Embodiment 3 of the present invention. Pulses P102 and P103 shown in FIG. 10 are shut-off signals disappearing due to a rise of the reference potential VS.

The first and second pulses in the input signal IN shown in FIG. 10 are referred to as "pulse IN1" and "pulse IN2," respectively, for ease of description. A comparison between circuit operations in response to the pulses IN1 and IN2 shown in FIG. 10 shows that the re-operating signal MASKOFF to the high-voltage level shift circuit 3 is generated only in the case where the mask signal MASKd fully overlaps the one-shot pulse OFFONESHOT and where the input signal is not transmitted to the drive circuit 5 at all.

On the other hand, in the circuit operation in response to the pulse IN2, the pulse P101 indicated by a broken line in FIG. 10 is not generated because the mask signal MASKd does not fully overlap the one-shot pulse OFFONESHOT. Also in this case, the drive signal OUT falls normally as a pulse 106 at a time when the pulse signal ONHVIN is low and when the pulse signal OFFHVIN becomes high.

In Embodiment 3, the generation of heat from the high-voltage level shift circuit 3 can be suppressed by inhibiting an unnecessary operation of the high-voltage level shift circuit 3. When the reference potential VS rises, the pulse in the pulse signals ONHVIN and OFFHVIN corresponding to the state of the input signal during the rise of the reference potential VS can be made high after the completion of the rise of the reference potential VS by the same circuit operation as that in Embodiment 1.

Embodiment 4

A drive circuit for a semiconductor element according to Embodiment 4 has the same circuit configuration as that of the drive circuit HVIC1 according to Embodiment 1 except that the primary circuit 11 is replaced with a primary circuit 11*c*. In the following description, therefore, components identical or corresponding to those in Embodiment 1 are assigned the same reference characters for description of them; the configuration is described mainly with respect to points of difference from that of Embodiment 1; and the descriptions of commonalities with Embodiment 1, for example, in terms of circuit configuration and circuit operation are simplified or omitted.

The drive circuit for a semiconductor element according to Embodiment 4 includes a delay circuit 61 which is connected to the dV/dt detection circuit 12 and which produces the re-operating signals MASKON and MASKOFF by delaying the mask signal MASKd. This configuration ensures that the latch malfunction can be avoided with stability.

Figure 11:
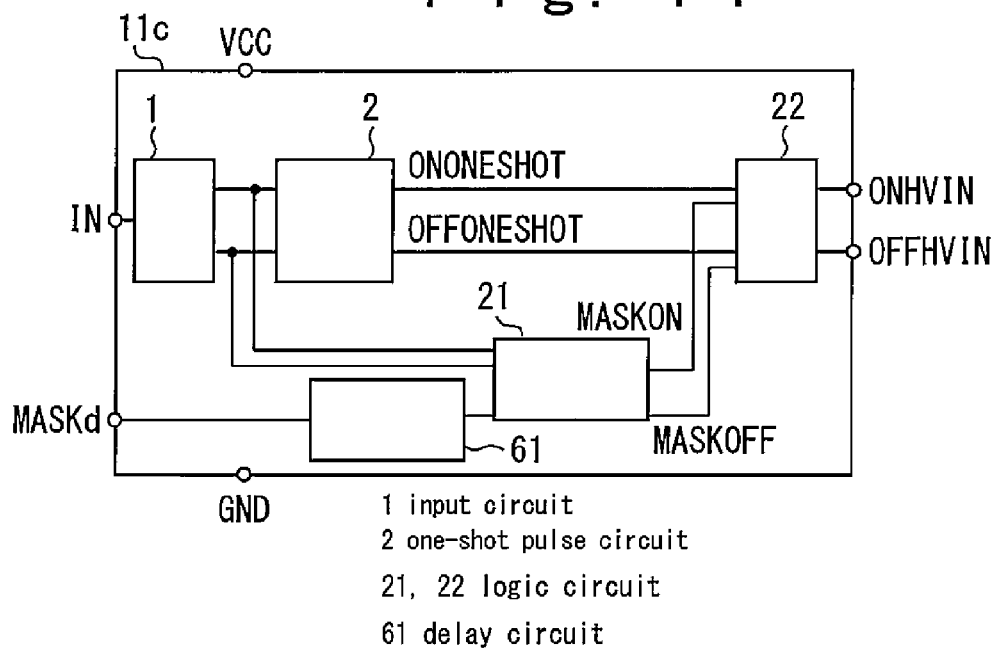
FIG. 11 is a circuit diagram showing the configuration of the drive circuit for a semiconductor element according to Embodiment 4 of the present invention.

FIG. 11 is a circuit diagram showing the configuration of the drive circuit for a semiconductor element according to Embodiment 4 of the present invention. FIG. 11 shows only the primary circuit 11*c* whose configuration is different from that in the drive circuit HVIC1 in Embodiment 1. The primary circuit 11*c* includes the delay circuit 61 in a stage before the logic circuit 21. The delay circuit 61 receives input of the mask signal MASKd and outputs a pulse formed by delaying the input by a predetermined delay time to the logic circuit 21. The logic circuit 21 receives the pulse from the delay circuit 61 and performs the same logical operation as that in Embodiment 1.

In Embodiment 1, delay of the re-operating signals MASKON and MASKOFF is performed by utilizing a signal delay due to, for example, the logical operation in the logic circuit 21. In contrast, in Embodiment 4, each of the re-operating signals MASKON and MASKOFF can be positively delayed largely.

Figure 12:
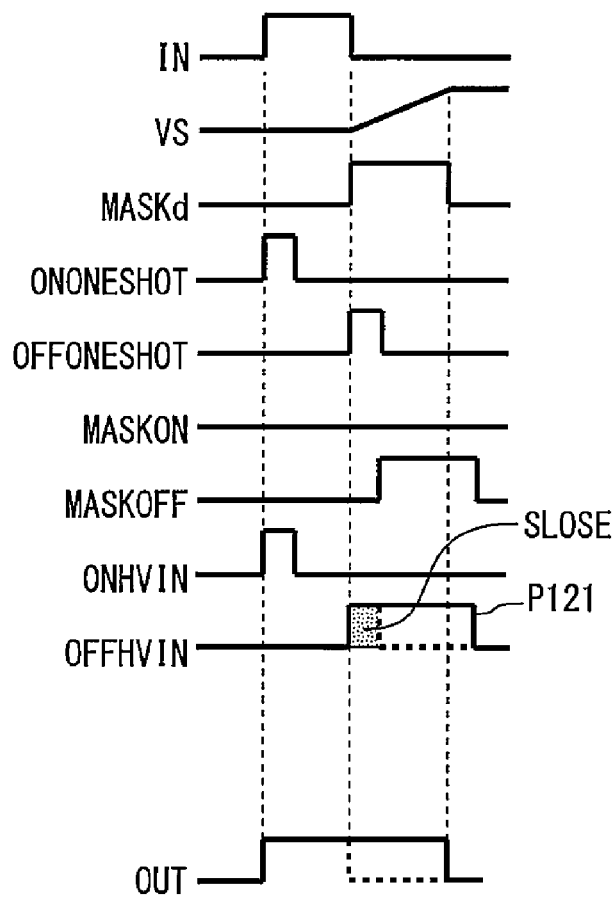
FIG. 12 is a time chart showing the operation of the drive circuit for a semiconductor element according to Embodiment 4 of the present invention.

FIG. 12 is a time chart showing the operation of the drive circuit for a semiconductor element according to Embodiment 4 of the present invention. It can be understood that the re-operating signal MASKOFF is largely delayed from the mask signal MASKd. In other respects, the circuit operation performed in the present embodiment is the same as that shown in the time chart of Embodiment 1 shown in FIG. 5. As a result, the falling edge of the pulse signal OFFHVIN can be sufficiently delayed relative to the falling edge of the mask signal MASKd (i.e., the reference potential VS rise end time).

In Embodiment 4 described above, the latch malfunction can be avoided with stability when the reference potential VS rises (when a change in voltage dV/dt occurs). The delay circuit 61 may be inserted in a stage subsequent to the logic circuit 21.

Not only a combination of Embodiment 4 and Embodiment 1 but also a combination of Embodiment 4 and Embodiment 2 or 3 may be made.

Embodiment 5

A drive circuit for a semiconductor element according to Embodiment 5 has the same circuit configuration as that of the drive circuit HVIC1 according to Embodiment 1 except that the primary circuit 11 is replaced with a primary circuit 11*d*. In the following description, therefore, components identical or corresponding to those in Embodiment 1 are assigned the same reference characters for description of them; the configuration is described mainly with respect to points of difference from that of Embodiment 1; and the descriptions of commonalities with Embodiment 1, for example, in terms of circuit configuration and circuit operation are simplified or omitted.

In a case where the pulse width of the mask signal MASKd is smaller than the width of the one-shot pulses from the one-shot pulse circuit 2, the input signal IN is normally transmitted to the drive circuit 5. In this case, there is no need to operate the high-voltage level shift circuit 3 with the re-operating signals MASKON and MASKOFF.

In Embodiment 5, therefore, the re-operating signals MASKON and MASKOFF to the high-voltage level shift circuit 3 are generated only when the width of the mask signal MASKd is equal to or larger than a certain value. The drive circuit for a semiconductor element according to Embodiment 5 is thereby enabled to make high one of the pulse signals ONHVIN and OFFHVIN after the completion of a rise of the reference potential VS only in a case where the pulse width of the mask signal MASKd is equal to or larger than a predetermined value.

Figure 13:
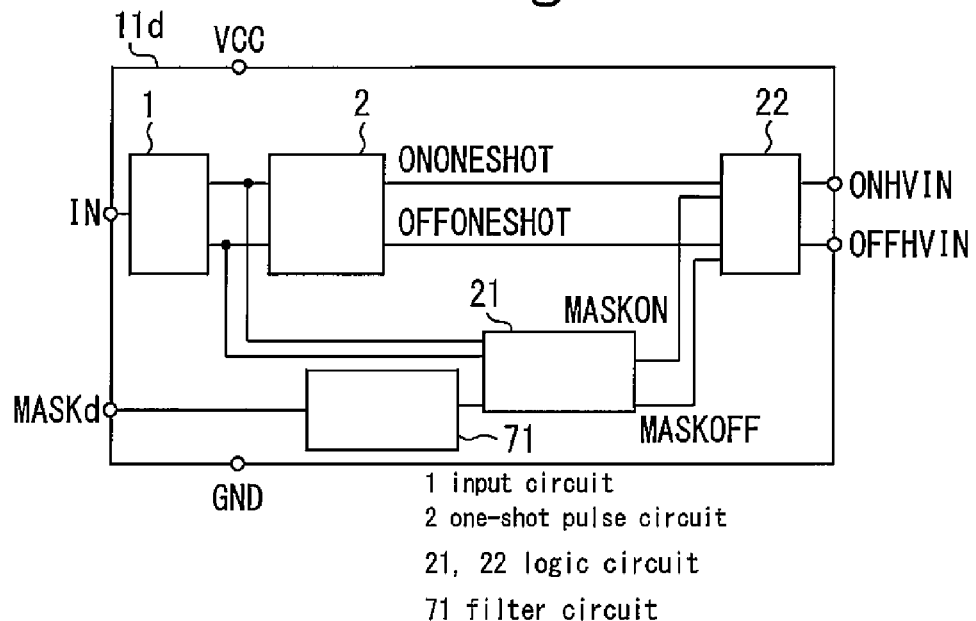
FIG. 13 is a circuit diagram showing the configuration of the drive circuit for a semiconductor element according to Embodiment 5 of the present invention.

FIG. 13 is a circuit diagram showing the configuration of the drive circuit for a semiconductor element according to Embodiment 5 of the present invention. FIG. 13 shows only the primary circuit 11*d* whose configuration is different from that in the drive circuit HVIC1 in Embodiment 1. In the primary circuit 11*d*, a filter circuit 71 is provided in a stage before the logic circuit 21.

The filter circuit 71 is a circuit which transmits a pulse of a width equal to or larger than a predetermined pulse width to the subsequent stage, and which does not transmit a pulse of a width smaller than the predetermined pulse width to the subsequent stage. In Embodiment 5, this predetermined pulse width is the pulse width W of the one-shot pulses ONONESHOT and OFFONESHOT. The mask signal MASKd is filtered with this filter circuit 71 to prevent the high-voltage level shift circuit 3 from performing an unnecessary operation.

Figure 14:
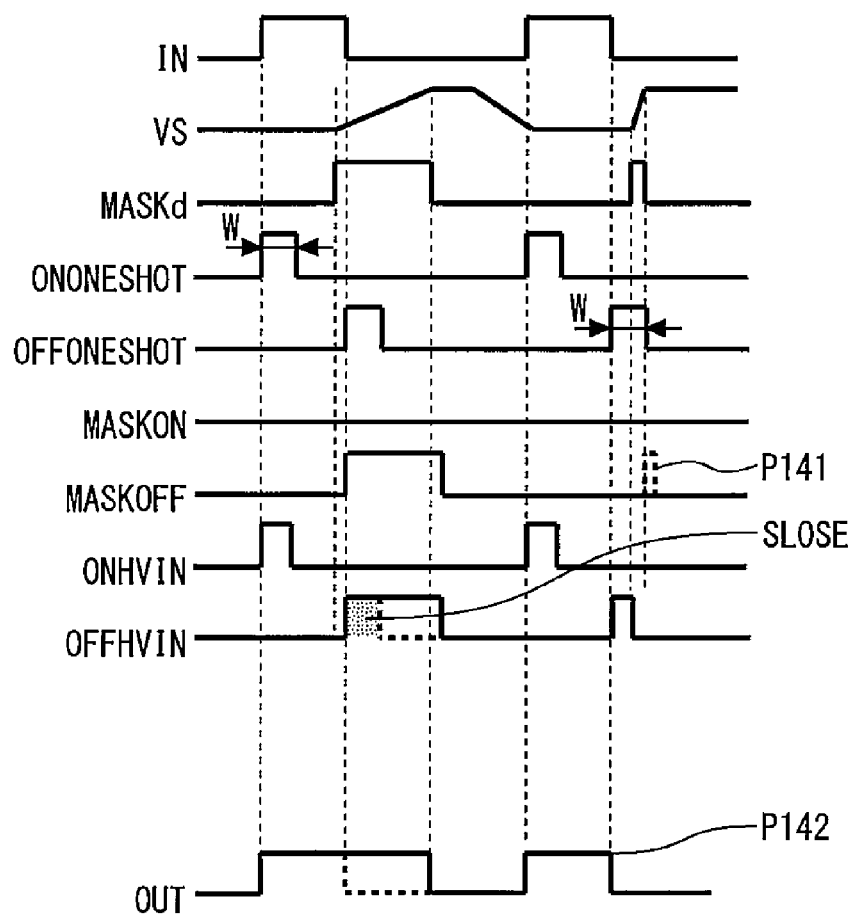
FIG. 14 is a time chart showing the operation of the drive circuit for a semiconductor element according to Embodiment 5 of the present invention.

FIG. 14 is a time chart showing the operation of the drive circuit for a semiconductor element according to Embodiment 5 of the present invention. The reference potential VS rises about two times. The first rise of the reference potential VS is such that the rise time period is relatively long and the mask signal MASKd is a pulse of a width longer than the pulse width W. On the other hand, the second rise of the reference potential VS is such that the rise time period is shorter than that in the case of the first rise and the mask signal MASKd is a pulse of a width shorter than the pulse width W.

At the time of the first rise of the reference potential VS, the mask signal MASKd is longer than the mask width W and, therefore, the re-operating signal MASKOFF is produced. At the time of the second rise of the reference potential VS, the mask signal MASKd is shorter than the mask width W and, therefore, the re-operating signal MASKOFF is not produced. A pulse P141 indicated by a broken line is a pulse not generated due to the function of the filter circuit 71.

In Embodiment 5, an effect of suppressing the generation of heat accompanying the circuit operation by inhibiting an unnecessary operation of the high-voltage level shift circuit 3 is achieved. The filter circuit 71 may be inserted in a stage subsequent to the logic circuit 21.

Embodiment 6

A drive circuit for a semiconductor element according to Embodiment 6 has the same circuit configuration as that of the drive circuit HVIC1 according to Embodiment 1 except that the primary circuit 11 is replaced with a primary circuit 11e. In the following description, therefore, components identical or corresponding to those in Embodiment 1 are assigned the same reference characters for description of them; the configuration is described mainly with respect to points of difference from that of Embodiment 1; and the descriptions of commonalities with Embodiment 1, for example, in terms of circuit configuration and circuit operation are simplified or omitted.

In Embodiments 1 to 5, one-shot re-operating signals ONRESHOT and OFFRESHOT for re-operating the high-voltage level shift circuit 3 may be generated by means of the mask signal MASKd detected with the dV/dt detection circuit 12. To realize this, the drive circuit for a semiconductor element according to Embodiment 6 is provided with a "one-shot pulse signal production circuit" for producing the one-shot re-operating signals ONRESHOT and OFFRESHOT. The "one-shot pulse signal production circuit" produces, according to the mask signal MASKd, re-one-shot pulses (ONRESHOT and OFFRESHOT), each of which falls after the falling edge of the mask signal MASKd.

Figure 15:
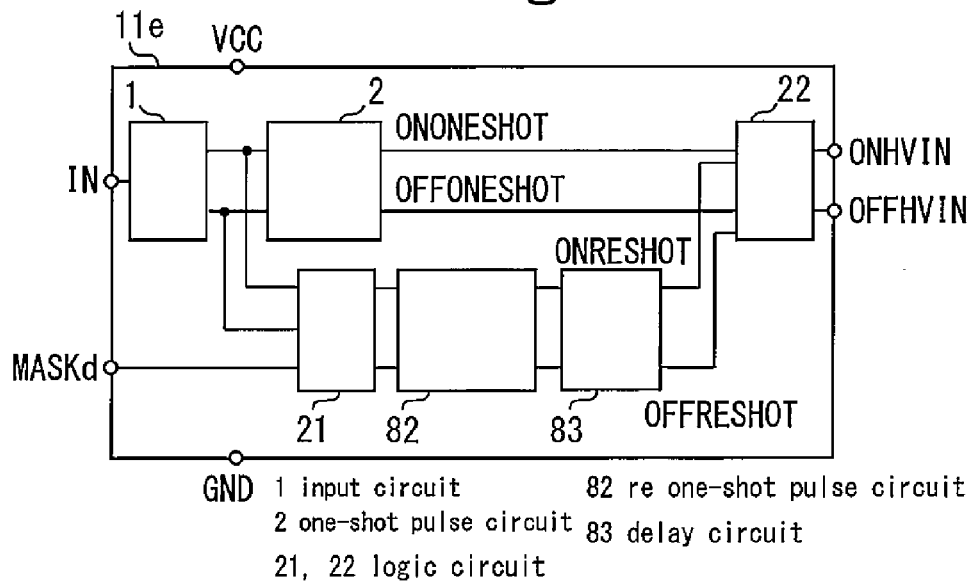
FIG. 15 is a circuit diagram showing the configuration of the drive circuit for a semiconductor element according to Embodiment 6 of the present invention.

FIG. 15 is a circuit diagram showing the configuration of the drive circuit for a semiconductor element according to Embodiment 6 of the present invention. FIG. 15 shows only the primary circuit 11e whose configuration is different from that in the drive circuit HVIC1 in Embodiment 1. The primary circuit 11e includes the logic circuit 21, a re-one-shot-pulse circuit 82 and a delay circuit 83. These circuits are connected in series by two wiring lines, respectively. These circuits, i.e., the logic circuit 21, the re-one-shot-pulse circuit 82 and the delay circuit 83 form the "one-shot pulse signal production circuit" according to Embodiment 6.

The re-one-shot-pulse circuit 82 generates one-shot re-operating signals ONRESHOT and OFFRESHOT by the mask signal MASKd. The delay circuit 83 delays the one-shot re-operating signals ONRESHOT and OFFRESHOT. The delay time is set to such a length that the one-shot re-operating signal ONRESHOT or OFFRESHOT is input to the high-voltage level shift circuit 3 after settlement of the rise (change dV/dt) of the reference potential VS.

Figure 16:
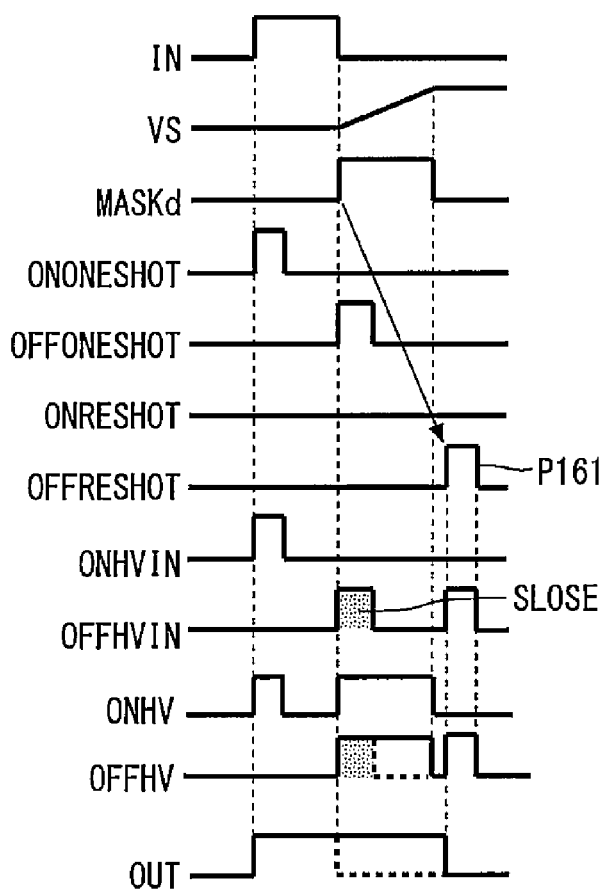
FIG. 16 is a time chart showing the operation of the drive circuit for a semiconductor element according to Embodiment 6 of the present invention.

FIG. 16 is a time chart showing the operation of the drive circuit for a semiconductor element according to Embodiment 6 of the present invention. As shown in FIG. 16, a pulse P161 of the one-shot re-operating signal OFFRESHOT is produced, with the rising edge of the mask signal MASKd used as a trigger. The pulse P161 is delayed to such an extent as to fall with a delay from the falling edge of the mask signal MASKd.

In Embodiment 6, the high-voltage level shift circuit 3 is operated by means of the one-shot re-operating signals ONRESHOT and OFFRESHOT, thus achieving an effect of enabling suppressing of the generation of heat accompanying the circuit operation by reducing the time taken by the high-voltage level shift circuit 3 to operate.

Embodiment 7

A drive circuit for a semiconductor element according to Embodiment 7 has the same circuit configuration as that of the drive circuit HVIC1 according to Embodiment 1 except that the primary circuit 11 is replaced with a primary circuit 11f. In the following description, therefore, components identical or corresponding to those in Embodiment 1 are assigned the same reference characters for description of them; the configuration is described mainly with respect to points of difference from that of Embodiment 1; and the descriptions of commonalities with Embodiment 1, for example, in terms of circuit configuration and circuit operation are simplified or omitted.

The one-shot re-operating signals ONRESHOT and OFFRESHOT generated in Embodiment 6 may be generated as pulses of an increased width. In the drive circuit for a semiconductor element according to Embodiment 7, such a circuit operation is realized.

Figure 17:
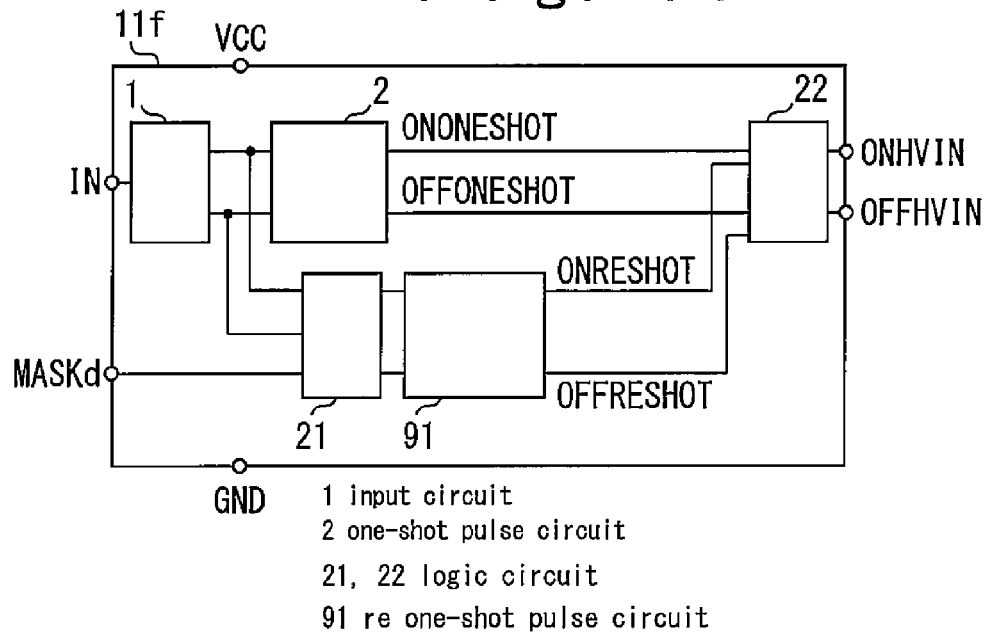
FIG. 17 is a circuit diagram showing the configuration of the drive circuit for a semiconductor element according to Embodiment 7 of the present invention.

FIG. 17 is a circuit diagram showing the configuration of the drive circuit for a semiconductor element according to Embodiment 7 of the present invention. FIG. 17 shows only the primary circuit 11f whose configuration is different from that in the drive circuit HVIC1 in Embodiment 1. The primary circuit 11f includes the logic circuit 21 and a re-one-shot-pulse circuit 91. The re-one-shot-pulse circuit 91 generates the one-shot re-operating signals ONRESHOT and OFFRESHOT larger in width than the mask signal MASKd to re-operate the high-voltage level shift circuit 3.

Figure 18:
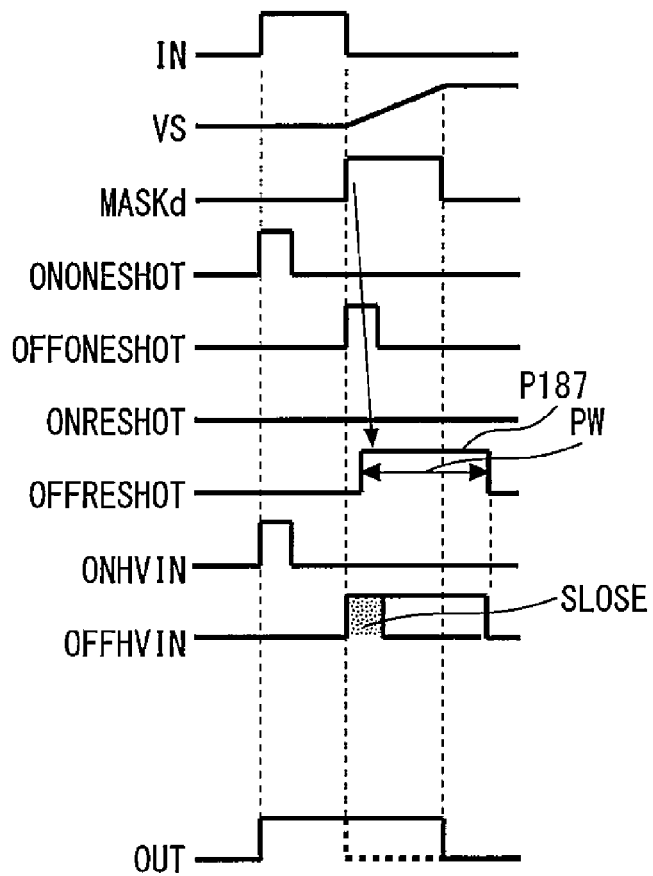
FIG. 18 is a time chart showing the operation of the drive circuit for a semiconductor element according to Embodiment 7 of the present invention.

FIG. 18 is a time chart showing the operation of the drive circuit for a semiconductor element according to Embodiment 7 of the present invention. In synchronization with the rising edge of the mask signal MASKd, the one-shot re-operating signal OFFRESHOT rises after a short delay time therefrom. This short delay time occurs due to passing through the logic circuit 21 and the re-one-shot-pulse circuit 91. The one-shot re-operating signal OFFRESHOT according to Embodiment 7 has a pulse width PW, and this pulse width PW is larger than the mask signal MASKd.

In Embodiment 7, the latch malfunction can be avoided with stability without using the delay circuit 83, thus realizing design simplification and space saving in comparison with Embodiment 6.

Embodiment 8

A drive circuit for a semiconductor element according to Embodiment 8 has the same circuit configuration as that of the drive circuit HVIC1 according to Embodiment 1 except that the primary circuit 11 is replaced with a primary circuit 11g. In the following description, therefore, components identical or corresponding to those in Embodiment 1 are assigned the same reference characters for description of them; the configuration is described mainly with respect to points of difference from that of Embodiment 1; and the descriptions of commonalities with Embodiment 1, for example, in terms of circuit configuration and circuit operation are simplified or omitted.

In Embodiments 6 and 7, each of the one-shot re-operating signals ONRESHOT and OFFRESHOT to the high-voltage level shift circuit 3 may be generated in synchronization with the falling edge of the mask signal MASKd detected with the dV/dt detection circuit 12. In the drive circuit for a semiconductor element according to Embodiment 8, such a circuit operation is realized.

Figure 19:
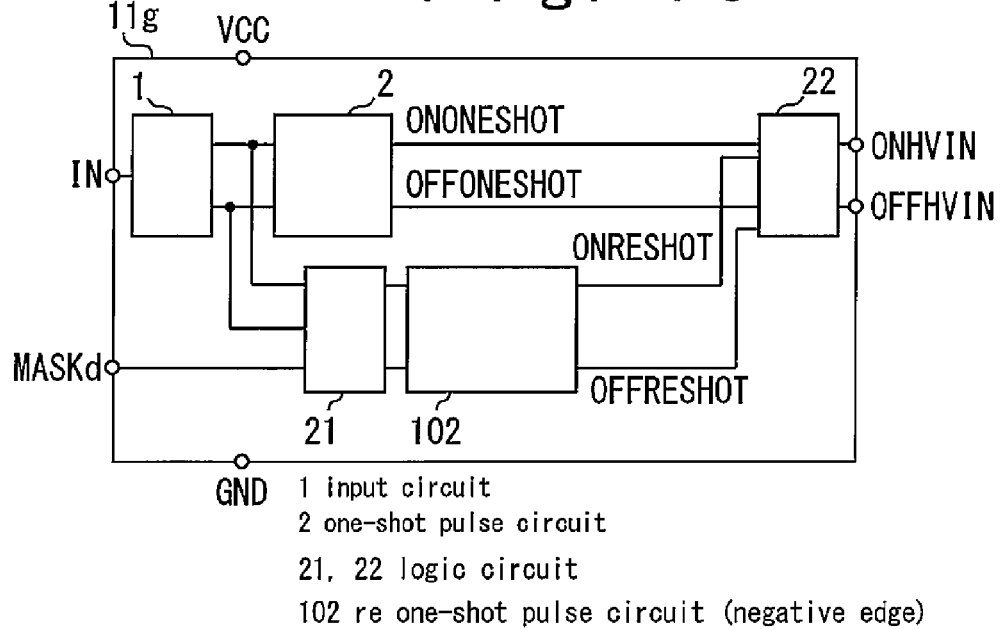
FIG. 19 is a circuit diagram showing the configuration of the drive circuit for a semiconductor element according to Embodiment 8 of the present invention.

FIG. 19 is a circuit diagram showing the configuration of the drive circuit for a semiconductor element according to Embodiment 8 of the present invention. FIG. 19 shows only the primary circuit 11g whose configuration is different from that in the drive circuit HVIC1 in Embodiment 1. The primary circuit 11g includes the logic circuit 21 and a re-one-shot-pulse circuit 102. The re-one-shot-pulse circuit 102 is of a negative edge type.

The primary circuit 11g generates each of the one-shot re-operating signals ONRESHOT and OFFRESHOT in synchronization of the falling edge of the mask signal MASKd. The one-shot re-operating signals ONRESHOT and OFFRESHOT are input to the high-voltage level shift circuit 3.

Figure 20:
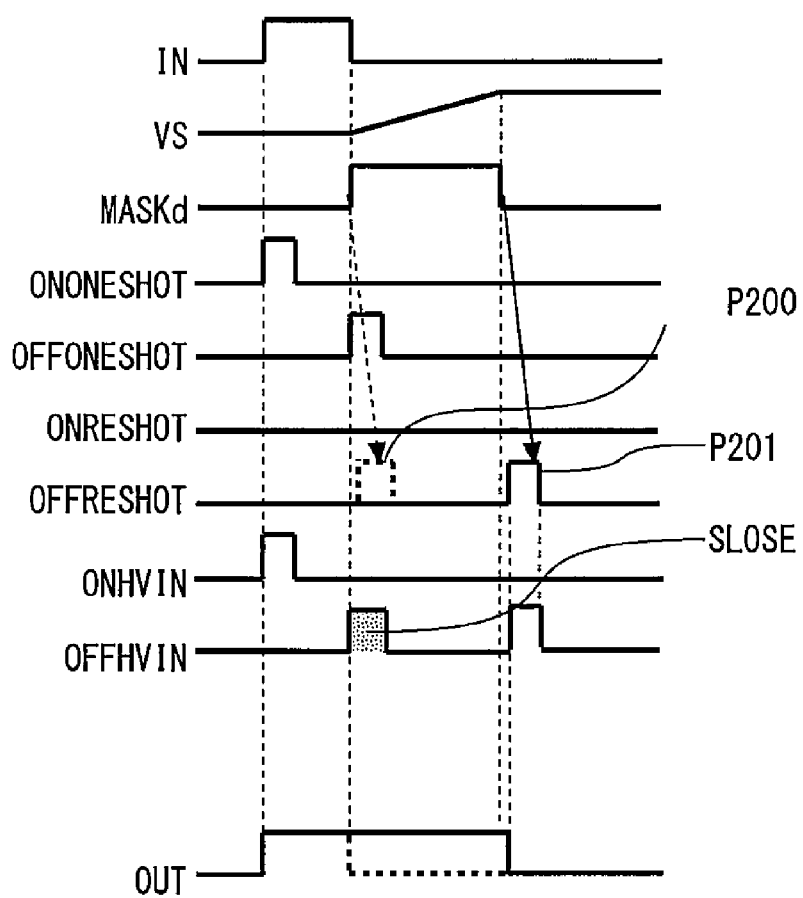
FIG. 20 is a time chart showing the operation of the drive circuit for a semiconductor element according to Embodiment 8 of the present invention.

FIG. 20 is a time chart showing the operation of the drive circuit for a semiconductor element according to Embodiment 8 of the present invention. The one-shot re-operating signal OFFRESHOT is produced not by using as a trigger the rising edge of the mask signal MASKd as a pulse P200 indicated by a broken line but by using as a trigger the falling edge of the mask signal MASKd as a pulse P201.

In Embodiment 8, the high-voltage level shift circuit 3 can be operated with stability. Also, since the need for the delay circuit 83 is eliminated, design simplification and space saving can be realized in comparison with Embodiment 6. Also, since the one-shot re-operating signal width can be reduced in comparison with Embodiment 7, an effect of enabling reducing the time taken by the high-voltage level shift circuit 3 to operate and enabling suppressing of the generation of heat accompanying the circuit operation is achieved.

Embodiment 9

A drive circuit for a semiconductor element according to Embodiment 9 has the same circuit configuration as that of the drive circuit HVIC1 according to Embodiment 1 except that the primary circuit 11 is replaced with a primary circuit 11h. In the following description, therefore, components identical or corresponding to those in Embodiment 1 are assigned the same reference characters for description of them; the configuration is described mainly with respect to points of difference from that of Embodiment 1; and the descriptions of commonalities with Embodiment 1, for example, in terms of circuit configuration and circuit operation are simplified or omitted.

In Embodiments 1 to 5, the re-operating signals ONHVIN and OFFHVIN to the high-voltage level shift circuit 3 may be regenerated by comparing the mask signal MASKd with the input signal IN and by re-operating the one-shot pulse circuit 2. In the drive circuit for a semiconductor element according to Embodiment 9, such a circuit operation is realized.

Figure 21:
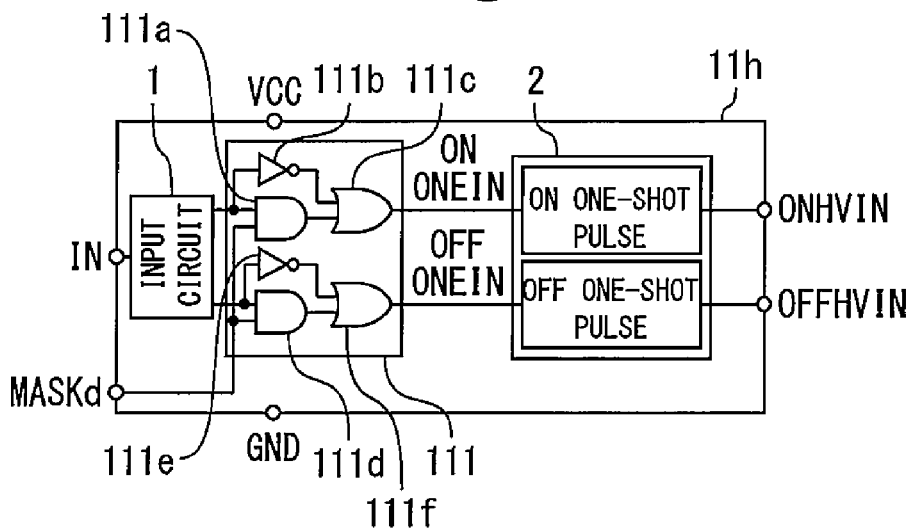
FIG. 21 is a circuit diagram showing the configuration of the drive circuit for a semiconductor element according to Embodiment 9 of the present invention.

FIG. 21 is a circuit diagram showing the configuration of the drive circuit for a semiconductor element according to Embodiment 9 of the present invention. FIG. 21 shows only the primary circuit 11h whose configuration is different from that in the drive circuit HVIC1 in Embodiment 9. The primary circuit 11h has a logic circuit 111 interposed between the input circuit 1 and a one-shot pulse circuit 2a. The logic circuit 111 compares the input signal IN and the mask signal MASKd and makes signals ONONEIN and OFFONEIN to the one-shot pulse circuit 2a high to reset the one-shot pulse circuit 2a. The one-shot pulse circuit 2a outputs one-shot pulses in synchronization with the falling edges of the signals ONONEIN and OFFONEIN.

More specifically, the logic circuit 111 incorporates AND circuits 111a and 111d, NOT circuits 111b and 111e and OR circuits 111c and 111f. The AND circuit 111a computes the logical product of the same pulse as the input signal IN and the mask signal MASKd and inputs the logical product to the OR circuit 111c. The NOT circuit 111b inverts the input signal IN and inputs the inverted signal to the OR circuit 111c. The OR circuit 111c computes the logical sum of the output from the AND circuit 111a and the output from the NOT circuit 111b and outputs the result as signal ONONEIN.

The AND circuit 111d computes the logical product of a pulse formed by inverting the input signal IN and the mask signal MASKd and inputs the logical product to the OR circuit 111f. The NOT circuit 111e again inverts the pulse formed by inverting the input signal IN and inputs the pulse to the OR circuit 111f. The OR circuit 111f computes the logical sum of the output from the AND circuit 111d and the output from the NOT circuit 111e and outputs the result as a signal OFFONEIN.

Figure 22:
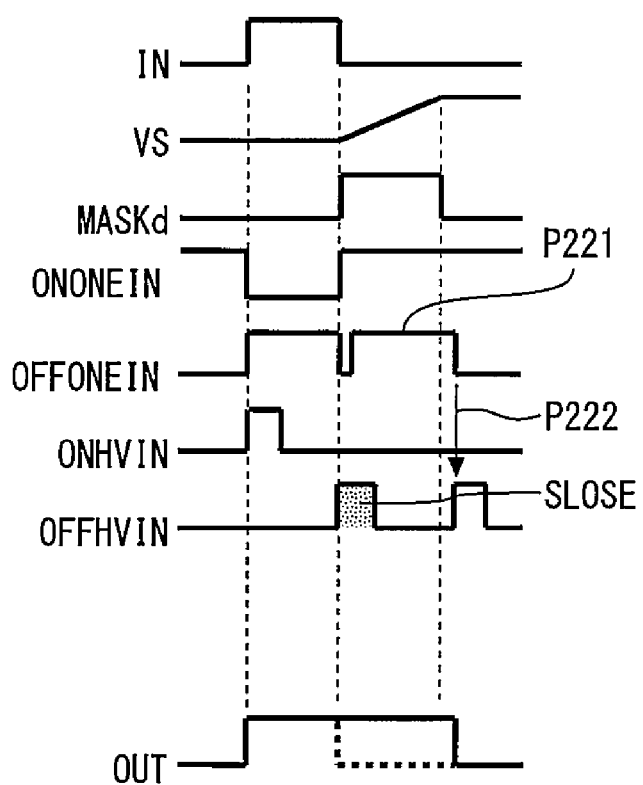
FIG. 22 is a time chart showing the operation of the drive circuit for a semiconductor element according to Embodiment 9 of the present invention.

FIG. 22 is a time chart showing the operation of the drive circuit for a semiconductor element according to Embodiment 9 of the present invention. The signals ONONEIN and OFFONEIN to the one-shot pulse circuit 2a are made high as shown at a pulse P221, thereby resetting the one-shot pulse circuit [[2]]2a. The one-shot pulse circuit 2a operates according to the falling edge of the signal OFFONEIN as indicated by an arrow P222 to regenerate the pulse signal OFFHVIN to the high-voltage level shift circuit 3 as indicated by the arrow P222.

In Embodiment 9, an effect of enabling reducing the time taken by the high-voltage level shift circuit 3 to operate and enabling suppressing of the generation of heat accompanying the circuit operation is achieved. Also, since there is no need to additionally provide a one-shot pulse circuit as in Embodiments 6 to 8, design simplification and space saving can be realized.

Embodiment 10

A drive circuit HVIC2 for a semiconductor element according to Embodiment 10 has the same circuit configuration as that of the drive circuit HVIC1 according to Embodiment 1 except that the secondary circuit 7 is replaced with a secondary circuit 122, and that a signal transmission circuit 121 is provided in place of the dV/dt detection circuit 12. In the following description, therefore, components identical or corresponding to those in Embodiment 1 are assigned the same reference characters for description of them; the configuration is described mainly with respect to points of difference from that of Embodiment 1; and the descriptions of commonalities with Embodiment 1, for example, in terms of circuit configuration and circuit operation are simplified or omitted.

In the drive circuit HVIC2 according to Embodiment 10, an interlock circuit 4a outputs a mask signal MASKi as well as the two outputs from the interlock circuit 4 according to Embodiment 1. The mask signal MASKi is a pulse which is high during a time period when both the pulse signals ONHV and OFFHV are high, i.e., during a time period when in-phase signals SPHASE are generated. In the drive circuits according to Embodiments 1 to 9, the mask signal MASKd is used. In the drive circuit according to Embodiment 10, the high-voltage level shift circuit 3 is re-operated by transmitting the mask signal MASKi to the primary circuit 11 via the signal transmission circuit 121 instead of using the mask signal MASKd.

Figure 23:
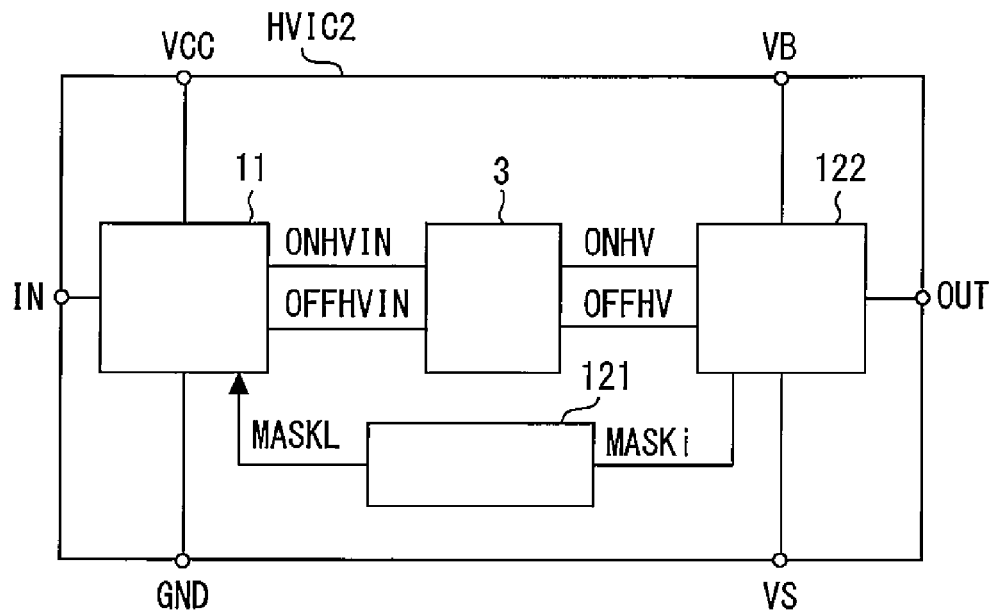
FIG. 23 is a circuit diagram showing the configuration of the drive circuit for a semiconductor element according to Embodiment 10 of the present invention.
Figure 24:
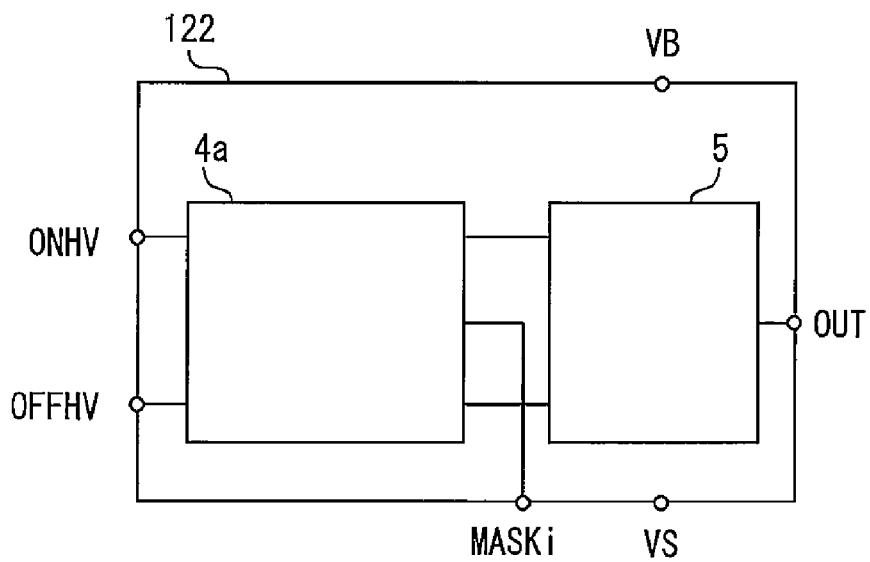
FIG. 24 is a circuit diagram showing the configuration of the drive circuit for a semiconductor element according to Embodiment 10 of the present invention.

FIG. 23 is a circuit diagram showing the configuration of the drive circuit HVIC2 for a semiconductor element according to Embodiment 10 of the present invention. FIG. 24 is a diagram showing internal components of the secondary circuit 122 according to Embodiment 10 of the present invention. In the drive circuit HVIC2 according to Embodiment 10, as shown in FIGS. 23 and 24, the mask signal MASKi output from the interlock circuit 4a in the secondary circuit 122 is input to the signal transmission circuit 121. The signal transmission circuit 121 outputs to the primary circuit 11 a mask signal MASKL obtained by delaying the mask signal MASKi to some extent.

Figure 26:
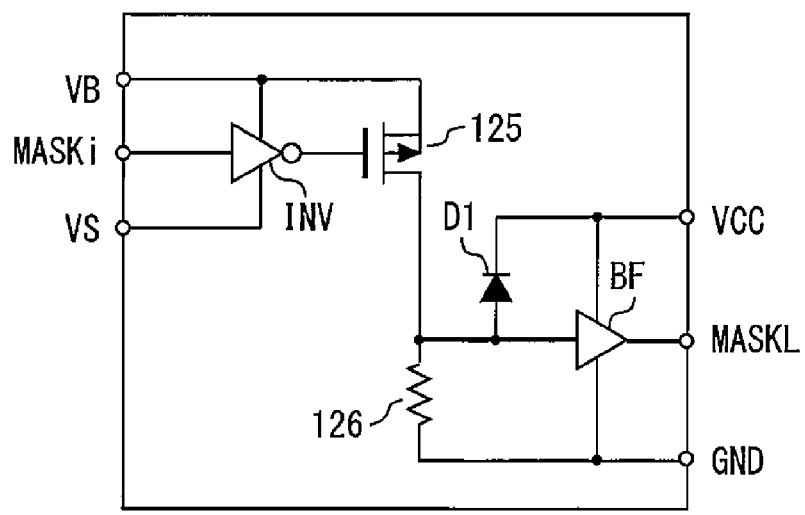
FIG. 26 is a circuit diagram showing the configuration of the drive circuit for a semiconductor element according to Embodiment 10 of the present invention.

FIG. 26 is a diagram showing a reverse level shift circuit 121a, which is an example of the signal transmission circuit 121. The reverse level shift circuit 121a includes an inverter INV, a high-withstand-voltage PMOS 125, a buffer BF, and a diode D1. The mask signal MASKi is input to the gate of the high-withstand-voltage PMOS 125 through the inverter INV. The source of the high-withstand-voltage PMOS 125 is connected to the power supply VB.

The drain of the high-withstand-voltage PMOS 125 is connected to one end of a resistor 126, and the other end of the resistor 126 is connected to the ground potential GND. The point of connection between the drain of the high-withstand-voltage PMOS 125 and the resistor 126 is connected to the input side of the buffer BF. An output from the buffer BF is the mask signal MASKL. The point of connection between the drain of the high-withstand-voltage PMOS 125 and the resistor 126 is connected to the anode of the diode D1, and the cathode of the diode D1 is connected to the power supply VCC.

Figure 25:
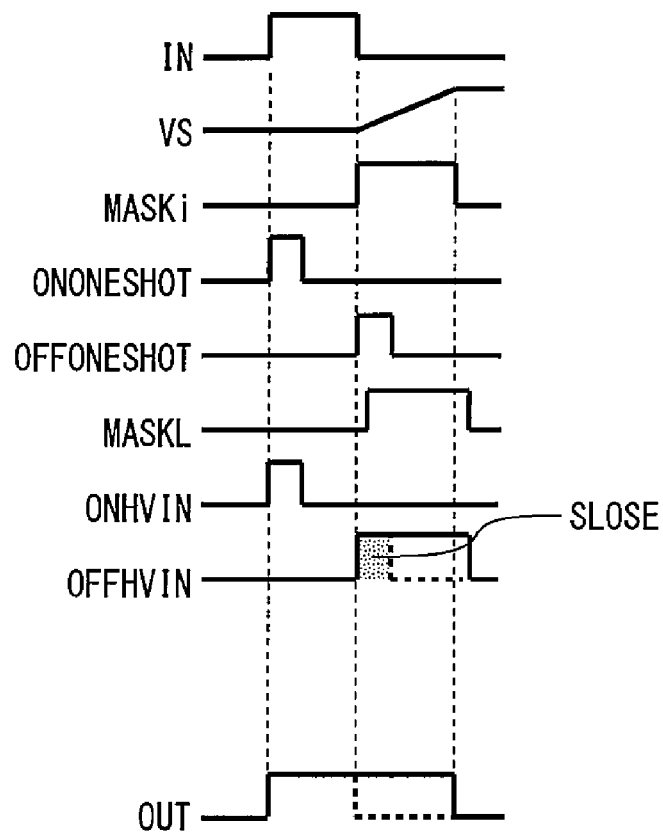
FIG. 25 is a time chart showing the operation of the drive circuit for a semiconductor element according to Embodiment 10 of the present invention.

FIG. 25 is a time chart showing the operation of the drive circuit for a semiconductor element according to Embodiment 10 of the present invention. The mask signal MASKi is delayed to form the mask signal MASKL. This mask signal MASKL is processed in the primary circuit 11 in place of the mask signal MASKd in Embodiments 1 to 9.

In the primary circuit 11, the re-operating signals MASKON and MASKOFF are produced as in Embodiment 1 and the logical operation between these re-operating signals and the one-shot pulses ONONESHOT and OFFONESHOT is performed.

As a result, the primary circuit 11 outputs the pulse signals ONHVIN and OFFHVIN shown in FIG. 25 and causes the drive signal OUT to fall to avoid the latch malfunction. Referring to FIG. 25, the falling edge of the pulse signal OFFHVIN is delayed by producing the re-operating signal MASKOFF and performing the logical operation in the primary circuit 11.

In Embodiment 10, the signal for shutting off the input signal IN and the signal for re-operating the high-voltage level-shift circuit 3 are synchronized with each other, thereby enabling the high-voltage level shift circuit 3 to be re-operated with stability. The signal transmitted from the secondary circuit 122 to the primary circuit 11 may be divided into a plurality of signals. A concrete example of such an operation will be described in the description of Embodiment 17 below.

Embodiment 11

A drive circuit HVIC3 for a semiconductor element according to Embodiment 11 has the same circuit configuration as that of the drive circuit HVIC2 according to Embodiment 10 except that the primary circuit 11 is replaced with a primary circuit 127, and that the dV/dt detection circuit 12 is provided. In the following description, therefore, components identical or corresponding to those in Embodiment 10 are assigned the same reference characters for description of them; the configuration is described mainly with respect to points of difference from that of Embodiment 10; and the descriptions of commonalities with Embodiment 10, for example, in terms of circuit configuration and circuit operation are simplified or omitted.

In Embodiment 10, the mask signal MASKi may be transmitted to the primary circuit 127 through the signal transmission circuit 121 and portions of the MASKL signals concurring with the mask signal MASKd may be removed from the MASKL signals input to the primary circuit 127. In the drive circuit HVIC3 according to Embodiment 11, such a circuit operation is realized.

Figure 27:
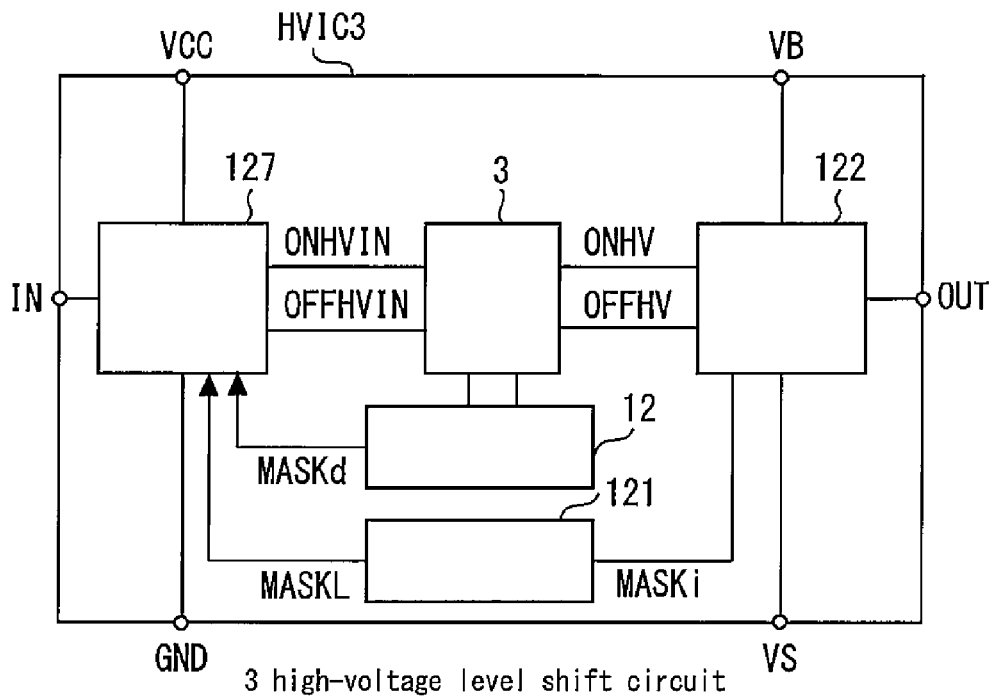
FIG. 27 is a circuit diagram showing the configuration of the drive circuit for a semiconductor element according to Embodiment 11 of the present invention.
Figure 28:
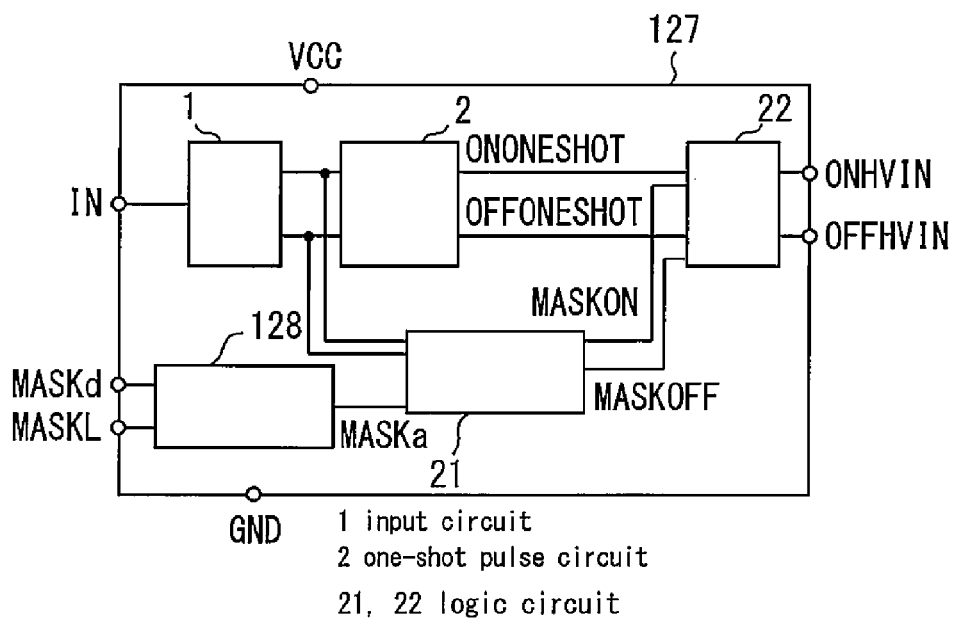
FIG. 28 is a circuit diagram showing the configuration of the drive circuit for a semiconductor element according to Embodiment 11 of the present invention.

FIG. 27 is a circuit diagram showing the configuration of the drive circuit HVIC3 for a semiconductor element according to Embodiment 11 of the present invention. FIG. 28 shows internal components of the primary circuit 127 in Embodiment 11. As shown in FIG. 28, the primary circuit 127 incorporates an interlock circuit 128.

The interlock circuit 128 receives the mask signals MASKd and MASKL and produces a mask signal MASKa. The mask signal MASKa is input to the logic circuit 21 and plays the same role as the mask signal MASKd in Embodiment 1. Referring to FIG. 27, the falling edge of the pulse signal OFFHVIN is delayed by producing the re-operating signal MASKOFF and performing the logical operation in the primary circuit 11.

Figure 29:
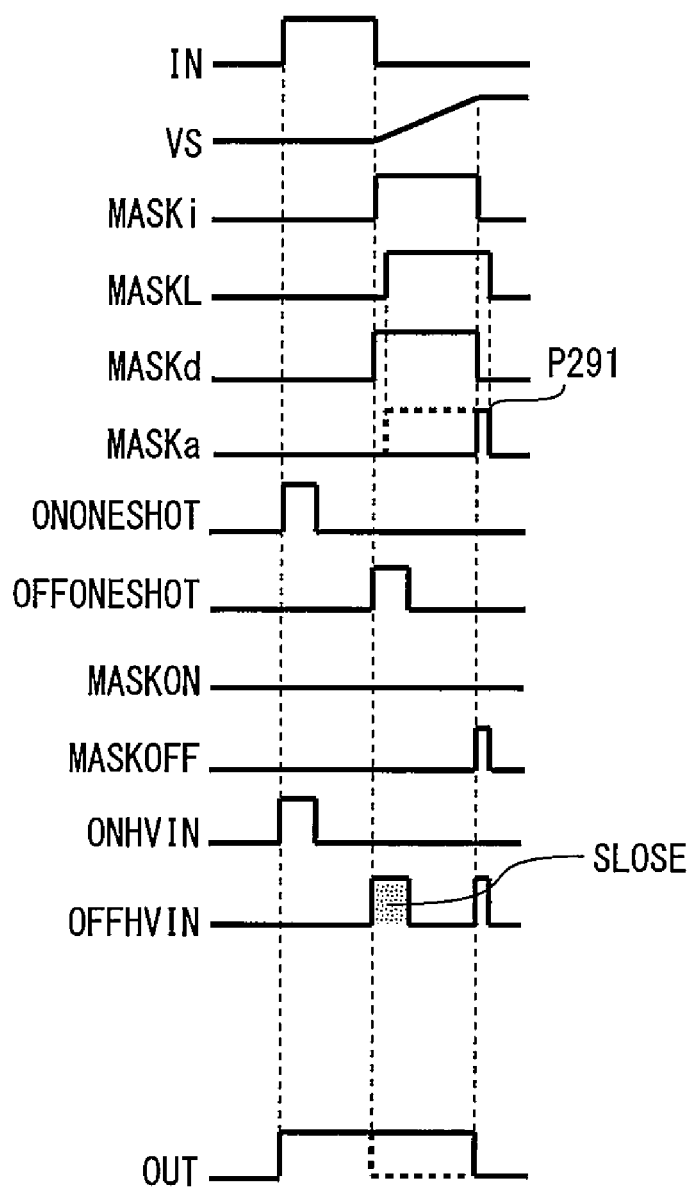
FIG. 29 is a time chart showing the operation of the drive circuit for a semiconductor element according to Embodiment 11 of the present invention.

FIG. 29 is a time chart showing the operation of the drive circuit HVIC3 for a semiconductor element according to Embodiment 11 of the present invention. During the time period when the mask signal MASKd is detected, in-phase signals SPHASE are generated and the high-voltage level shift circuit 3 therefore malfunctions. There is, therefore, no need to produce and input the re-operating signals MASKON and MASKOFF to the high-voltage level shift circuit 3.

Then, to inhibit the generation of the unnecessary re-operating signals MASKON and MASKOFF, the mask signal MASKd is removed from the pulse waveform of the MASKL signal by the interlock circuit 128 inserted in the stage before the logic circuit 21 in the primary circuit 127.

As a result, a pulse P291 is produced. This pulse P291 is the mask signal MASKa. The re-operating signals MASKON and MASKOFF are produced by using this pulse.

In Embodiment 11, an unnecessary operation of the circuit can be inhibited to suppress the generation of heat from the high-voltage level shift circuit 3.

Embodiment 12

A drive circuit HVIC4 for a semiconductor element according to Embodiment 12 has the same circuit configuration as that of the drive circuit HVIC2 according to Embodiment 10 except that the secondary circuit 7 is replaced with a secondary circuit 124. In the following description, therefore, components identical or corresponding to those in Embodiment 10 are assigned the same reference characters for description of them; the configuration is described mainly with respect to points of difference from that of Embodiment 10; and the descriptions of commonalities with Embodiment 10, for example, in terms of circuit configuration and circuit operation are simplified or omitted.

In Embodiments 10 and 11, the mask signal MASKi detected with the interlock circuit 4 in the secondary circuit 124 may be positively delayed by using a delay circuit before being transmitted to the primary circuit 11. In the drive circuit HVIC4 according to Embodiment 12, such a circuit operation is realized.

Figure 30:
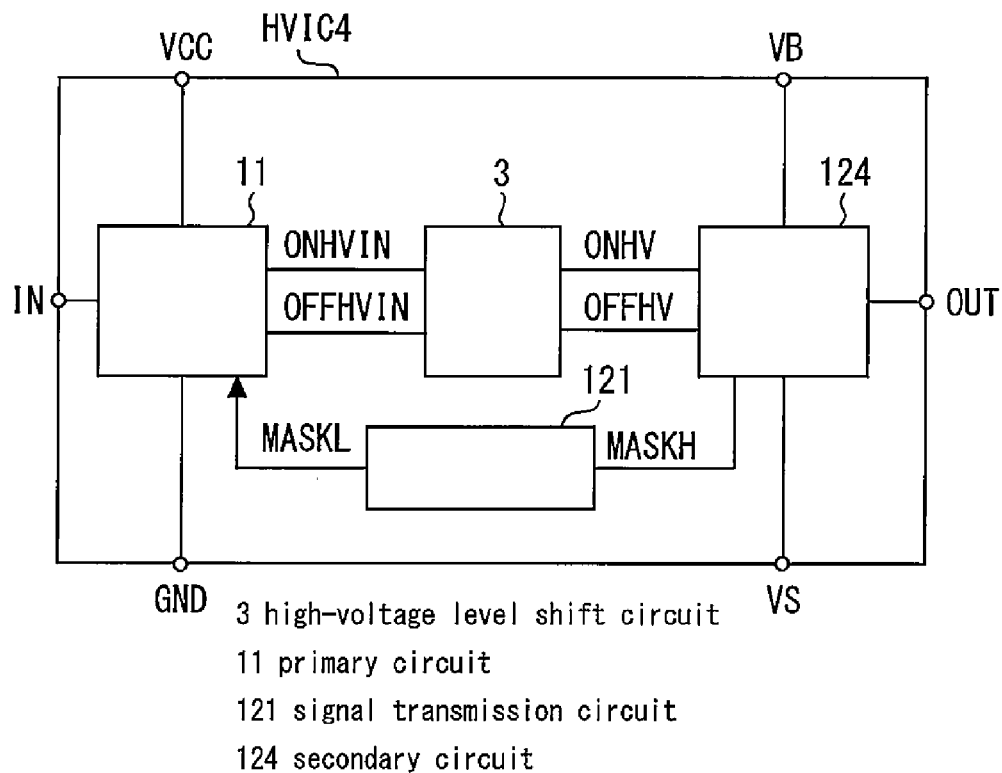
FIG. 30 is a circuit diagram showing the configuration of the drive circuit for a semiconductor element according to Embodiment 12 of the present invention.
Figure 31:
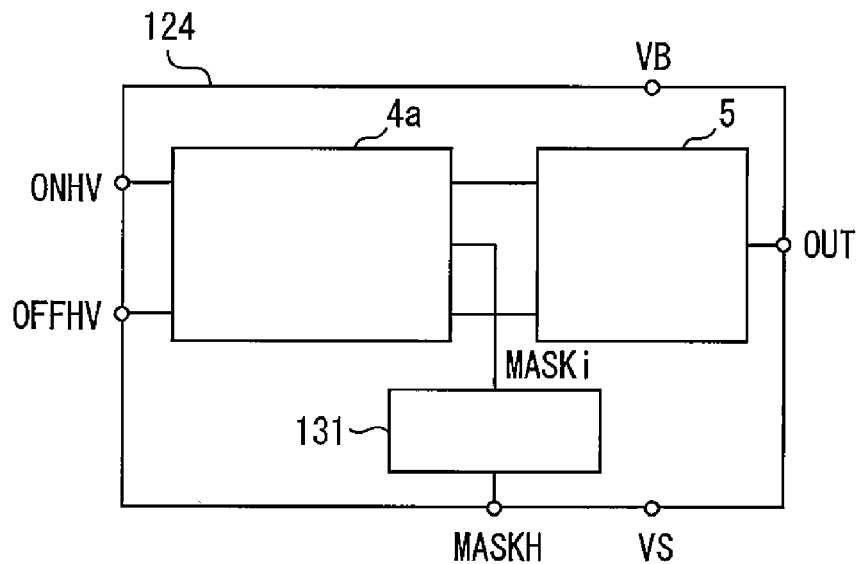
FIG. 31 is a circuit diagram showing the configuration of the drive circuit for a semiconductor element according to Embodiment 12 of the present invention.

FIG. 30 is a circuit diagram showing the configuration of the drive circuit HVIC4 for a semiconductor element according to Embodiment 12 of the present invention. FIG. 31 shows internal components of the secondary circuit 124 according to Embodiment 12 of the present invention. As shown in FIG. 31, the secondary circuit 124 includes a delay circuit 131.

The delay circuit 131 receives the mask signal MASKi from the interlock circuit 4a and outputs a mask signal MASKH obtained by delaying the mask signal MASKi. Thus, the delay circuit 131 is inserted in a stage subsequent to the interlock circuit 4a to delay the mask signal MASKi.

Figure 32:
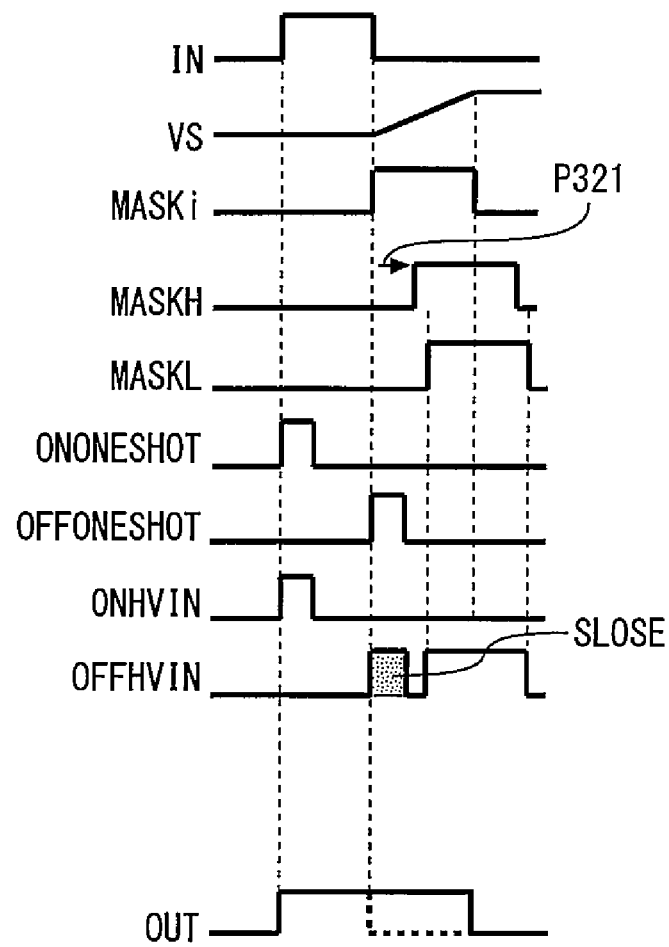
FIG. 32 is a time chart showing the operation of the drive circuit for a semiconductor element according to Embodiment 12 of the present invention.

FIG. 32 is a time chart showing the operation of the drive circuit for a semiconductor element according to Embodiment 12 of the present invention. The mask signal MASKi is delayed as indicated by an arrow P321 to produce the mask signal MASKH.

This mask signal MASKH is input to the signal transmission circuit 121, and the signal transmission circuit 121 outputs to the primary circuit 11 the mask signal MASKL obtained by further delaying the mask signal MASKH. The mask signal MASKL plays the same role as the mask signal MASKd in Embodiment 1. Referring to FIG. 32, the falling edge of the pulse signal OFFHVIN is delayed by producing the re-operating signal MASKOFF and performing the logical operation in the primary circuit 11.

In Embodiment 12, the mask signal is transmitted from the secondary circuit 124 to the primary circuit 11 after settlement of the rise (change dV/dt) of the reference potential VS, thereby enabling signal transmission with stability.

Embodiment 13

A drive circuit for a semiconductor element according to Embodiment 13 has the same circuit configuration as that of the drive circuit HVIC4 according to Embodiment 12 except that the secondary circuit 124 is replaced with a secondary circuit 124a. In the following description, therefore, components identical or corresponding to those in Embodiment 12 are assigned the same reference characters for description of them; the configuration is described mainly with respect to points of difference from that of Embodiment 12; and the descriptions of commonalities with Embodiment 12, for example, in terms of circuit configuration and circuit operation are simplified or omitted.

When the mask signal MASKi smaller in width than the one-shot pulse width is detected, the input signal is transmitted to the drive circuit 5 and there is, therefore, no need to re-operate the high-voltage level shift circuit 3. In Embodiment 13, the mask signal MASKi detected with the interlock circuit 4a in the secondary circuit 124 in Embodiments 10 to 12 is transmitted to the primary circuit 11 only when the width of the mask signal MASKi is equal to or larger than a certain width.

Figure 33:
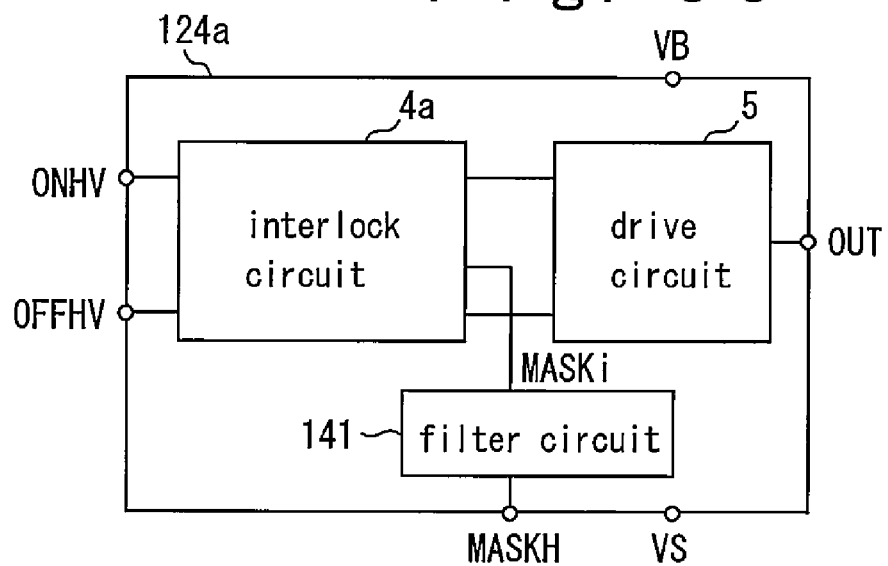
FIG. 33 is a circuit diagram showing the configuration of the drive circuit for a semiconductor element according to Embodiment 13 of the present invention.

FIG. 33 shows internal components of the secondary circuit 124a in Embodiment 13. As shown in FIG. 33, the secondary circuit 124a includes a filter circuit 141 in a stage subsequent to the interlock circuit 4a. The filter circuit 141 is a circuit which transmits a pulse of a width equal to or larger than a predetermined pulse width to the subsequent stage, and which does not transmit a pulse of a width smaller than the predetermined pulse width to the subsequent stage. In Embodiment 13, this predetermined pulse width is the pulse width W of the one-shot pulses ONONESHOT and OFFONESHOT.

Figure 34:
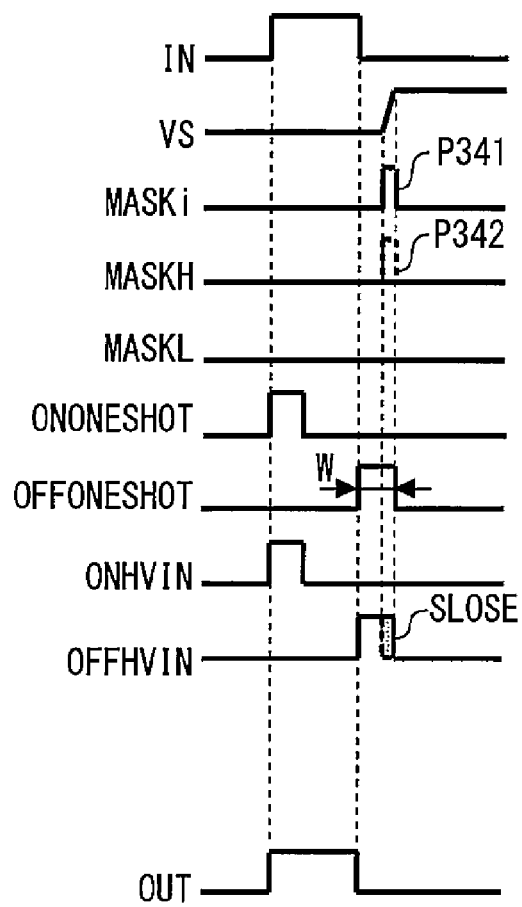
FIG. 34 is a time chart showing the operation of the drive circuit for a semiconductor element according to Embodiment 13.

FIG. 34 is a time chart showing the operation of the drive circuit for a semiconductor element according to Embodiment 13. The width of a pulse P341 in the mask signal MASKi is smaller than the pulse width W. Therefore, the filter circuit 141 blocks the signal so that the signal is not transmitted to the subsequent stage. As a result, a pulse P342 indicated by a broken line is not generated. Referring to FIG. 34, the rising edge of OFFHVIN appears before the rising edge of the in-phase signal SPHASE, so that the drive signal OUT falls normally.

The mask signal MASKi is filtered with the filter circuit 141 to inhibit unnecessary operation of the signal transmission circuit 121, thereby enabling inhibition of an unnecessary operation of the high-voltage level shift circuit 3. An effect of enabling suppressing of the generation of heat accompanying the circuit operation is thus achieved.

Embodiment 14

A drive circuit for a semiconductor element according to Embodiment 14 has the same circuit configuration as that of the drive circuit HVIC4 according to Embodiment 12 except that the secondary circuit 124 is replaced with a secondary circuit 124b. In the following description, therefore, components identical or corresponding to those in Embodiment 12 are assigned the same reference characters for description of them; the configuration is described mainly with respect to points of difference from that of Embodiment 12; and the descriptions of commonalities with Embodiment 12, for example, in terms of circuit configuration and circuit operation are simplified or omitted.

In Embodiments 10 to 13, the one-shot pulse signal MASKH may be generated by using the mask signal MASKi as a trigger. In the drive circuit according to Embodiment 14, such a circuit operation is realized.

Figure 35:
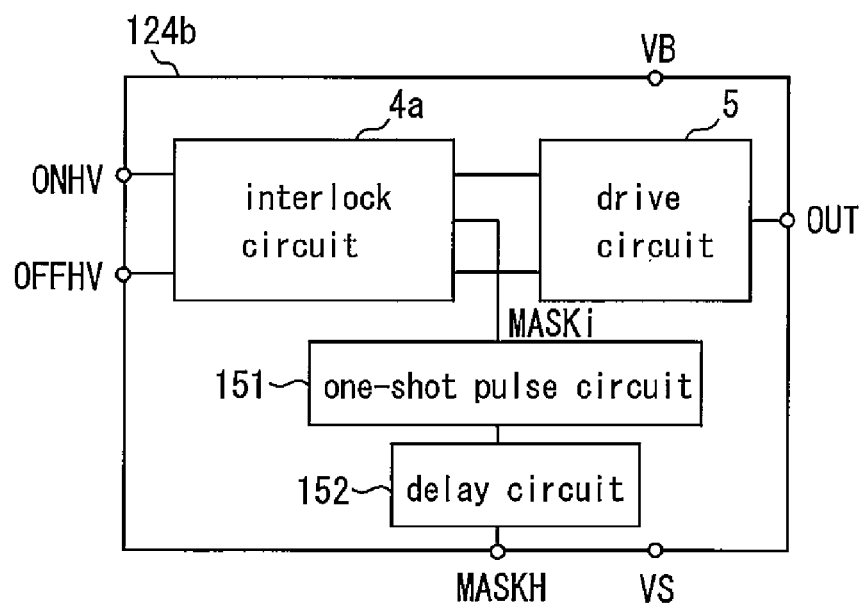
FIG. 35 is a circuit diagram showing the configuration of the drive circuit for a semiconductor element according to Embodiment 14 of the present invention.

FIG. 35 shows internal components of the secondary circuit 124b according to Embodiment 14 of the present invention. In the secondary circuit 124b, as shown in FIG. 35, a one-shot pulse circuit 151 and a delay circuit 152 are connected in series in a stage subsequent to the interlock circuit 4a. A one-shot pulse signal is generated by the one-shot pulse circuit 151.

The delay circuit 152 delays this one-shot pulse signal, thereby enabling the one-shot pulse signal MASKH to be transmitted to the primary circuit 11 after settlement of the rise (change dV/dt) of the reference potential VS.

Figure 36:
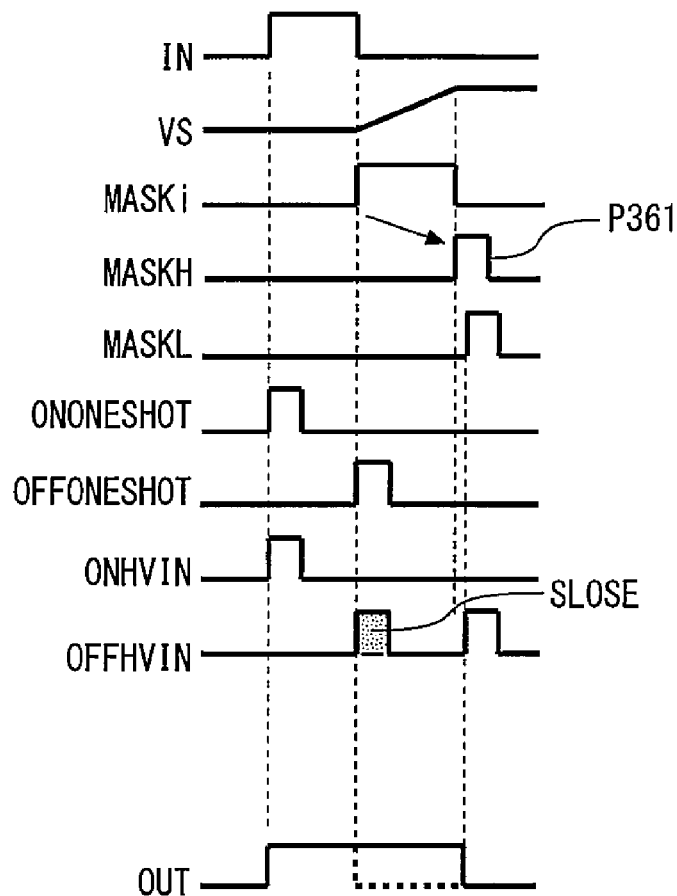
FIG. 36 is a time chart showing the operation of the drive circuit for a semiconductor element according to Embodiment 14 of the present invention.

FIG. 36 is a time chart showing the operation of the drive circuit for a semiconductor element according to Embodiment 14 of the present invention. The one-shot pulse circuit 151 generates a one-shot pulse signal and the delay circuit 152 delays this one-shot pulse signal, thereby generating a pulse P361 in FIG. 36. The mask signal MASKL is produced from the pulse P361 and is used as a re-operating signal, thereby finally producing OFFHVIN.

In Embodiment 14, the time taken by the signal transmission circuit 121 to operate can be reduced and the generation of heat accompanying the circuit operation can be suppressed.

Embodiment 15

A drive circuit for a semiconductor element according to Embodiment 15 has the same circuit configuration as that of the drive circuit HVIC4 according to Embodiment 12 except that the secondary circuit 124 is replaced with a secondary circuit 124c. In the following description, therefore, components identical or corresponding to those in Embodiment 12 are assigned the same reference characters for description of them; the configuration is described mainly with respect to points of difference from that of Embodiment 12; and the descriptions of commonalities with Embodiment 12, for example, in terms of circuit configuration and circuit operation are simplified or omitted.

In Embodiment 14, the mask signal MASKH to be transmitted to the primary circuit 11 may be produced as a one-shot pulse having a width larger than that of the mask signal MASKi when the mask signal MASKH is generated from the mask signal MASKi. In the drive circuit according to Embodiment 15, such a circuit operation is realized.

Figure 37:
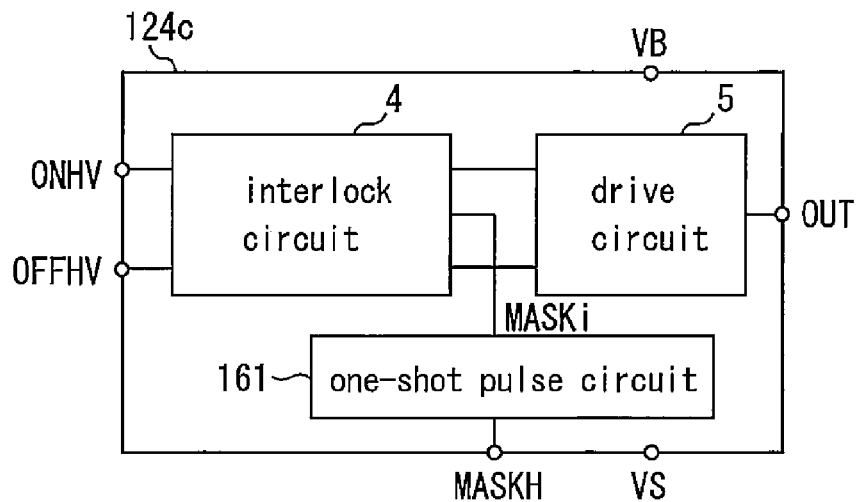
FIG. 37 is a circuit diagram showing the configuration of the drive circuit for a semiconductor element according to Embodiment 15 of the present invention.

FIG. 37 shows internal components of the secondary circuit 124c according to Embodiment 15 of the present invention. As shown in FIG. 37, the secondary circuit 124c includes a one-shot pulse circuit 161 provided in a stage subsequent to the interlock circuit 4a.

The one-shot pulse circuit 161 receives the mask signal MASKi and generates a one-shot pulse signal larger in width than the mask signal MASKi. This one-shot pulse signal is used as mask signal MASKH and transmitted to the primary circuit 11.

Figure 38:
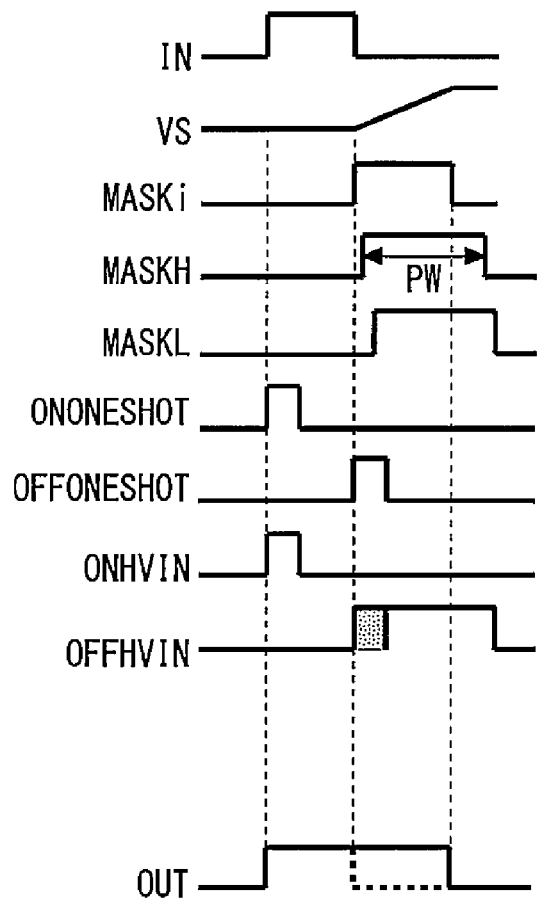
FIG. 38 is a time chart showing the operation of the drive circuit for a semiconductor element according to Embodiment 15 of the present invention.

FIG. 38 is a time chart showing the operation of the drive circuit for a semiconductor element according to Embodiment 15 of the present invention. It can be understood that the pulse width PW of the mask signal MASKH is larger than the pulse width of the mask signal MASKi. This mask signal MASKH is input to the signal transmission circuit 121, and the signal transmission circuit 121 outputs the mask signal MASKL. The primary circuit 11 having received this mask signal MASKL finally produces the pulse signals ONHVIN and OFFHVIN properly, as does that in Embodiment 12.

In Embodiment 15, by making the width of the mask signal MASKH larger, the high-voltage level shift circuit 3 can be re-operated with stability without delaying the signal with the delay circuit 152.

In Embodiment 15, since there is no need for the delay circuit 152, design simplification and space saving can be realized in comparison with Embodiment 13.

Embodiment 16

A drive circuit for a semiconductor device according to Embodiment 16 has the same circuit configuration as that of the drive circuit HVIC4 according to Embodiment 12 except that the secondary circuit 124 is replaced with a secondary circuit 124d. In the following description, therefore, components identical or corresponding to those in Embodiment 12 are assigned the same reference characters for description of them; the configuration is described mainly with respect to points of difference from that of Embodiment 12; and the descriptions of commonalities with Embodiment 12, for example, in terms of circuit configuration and circuit operation are simplified or omitted.

In Embodiments 14 and 15, the mask signal MASKH to be transmitted to the primary circuit 11 may be generated when the mask signal MASKi detected with the interlock circuit 4 in the secondary circuit 124 falls. In the drive circuit according to Embodiment 16, such a circuit operation is realized.

Figure 39:
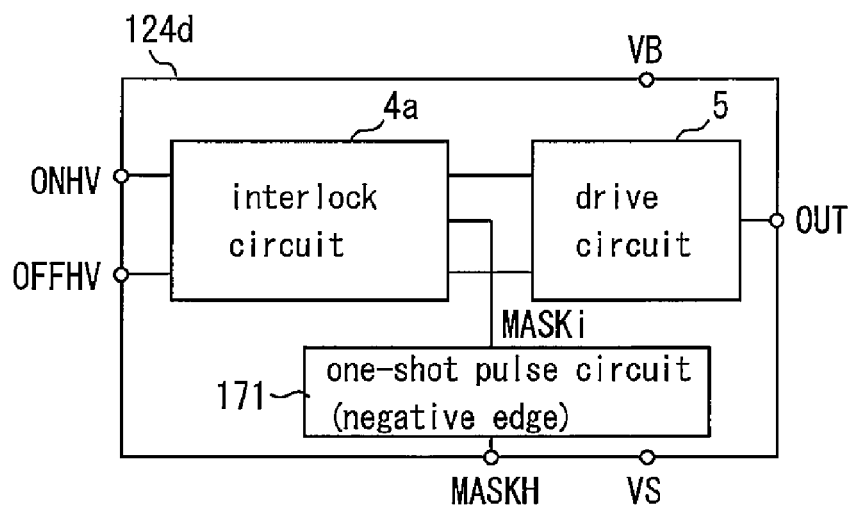
FIG. 39 is a circuit diagram showing the configuration of the drive circuit for a semiconductor element according to Embodiment 16 of the present invention.

FIG. 39 shows internal components of the secondary circuit 124d according to Embodiment 16 of the present invention. As shown in FIG. 39, the secondary circuit 124d includes a negative-edge-type one-shot pulse circuit 171 provided in a stage subsequent to the interlock circuit 4a. The one-shot pulse circuit 171 generates the one-shot pulse signal MASKH by using the falling edge of the mask signal MASKi as a trigger.

Figure 40:
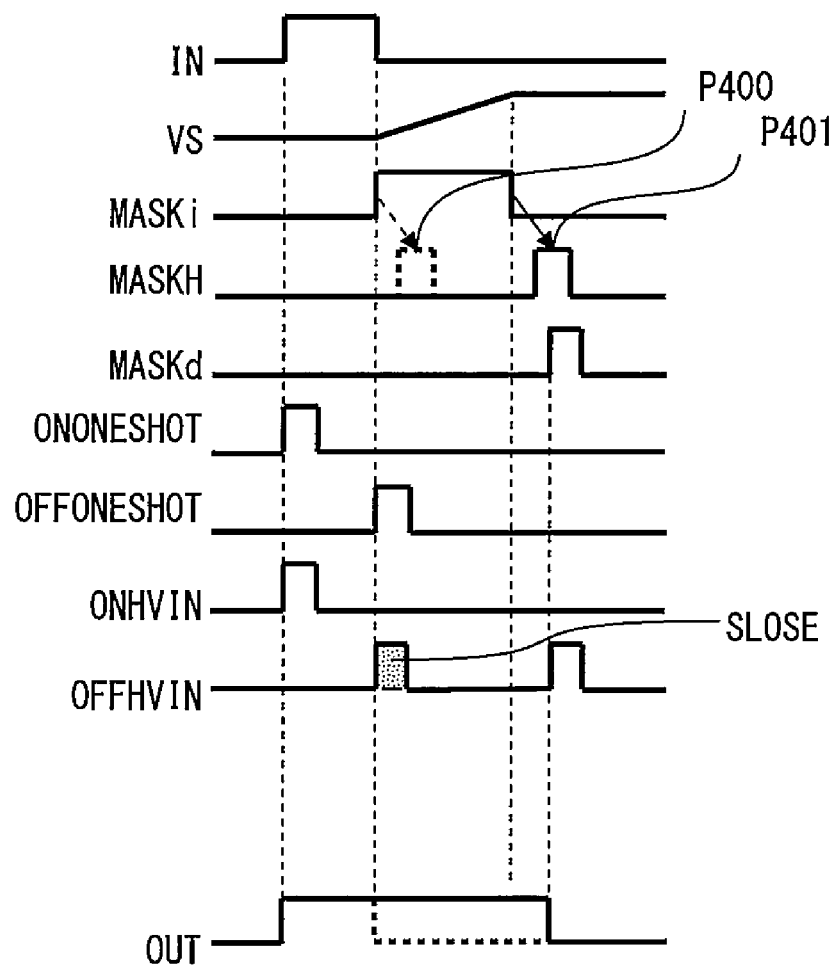
FIG. 40 is a time chart showing the operation of the drive circuit for a semiconductor element according to Embodiment 16 of the present invention.

FIG. 40 is a time chart showing the operation of the drive circuit for a semiconductor element according to Embodiment 16 of the present invention. The mask signal MASKH is produced not like a pulse P400 indicated by a broken line by using the rising edge of the mask signal MASKi as a trigger but like a pulse P401 by using the falling edge of the mask signal MASKi as a trigger.

In Embodiment 16, the one-shot pulse signal can be generated after settlement of the rise (change dV/dt) of the reference potential VS, thereby enabling the signal transmission circuit 121 to operate with stability.

Since there is no need for the delay circuit 152, design simplification and space saving can be realized in comparison with Embodiment 14. Also, since the one-shot pulse signal width can be reduced in comparison with Embodiment 15, an effect of enabling reducing the time taken by the signal transmission circuit 121 to operate and enabling suppressing of the generation of heat accompanying the circuit operation is achieved.

Embodiment 17

Figure 41:
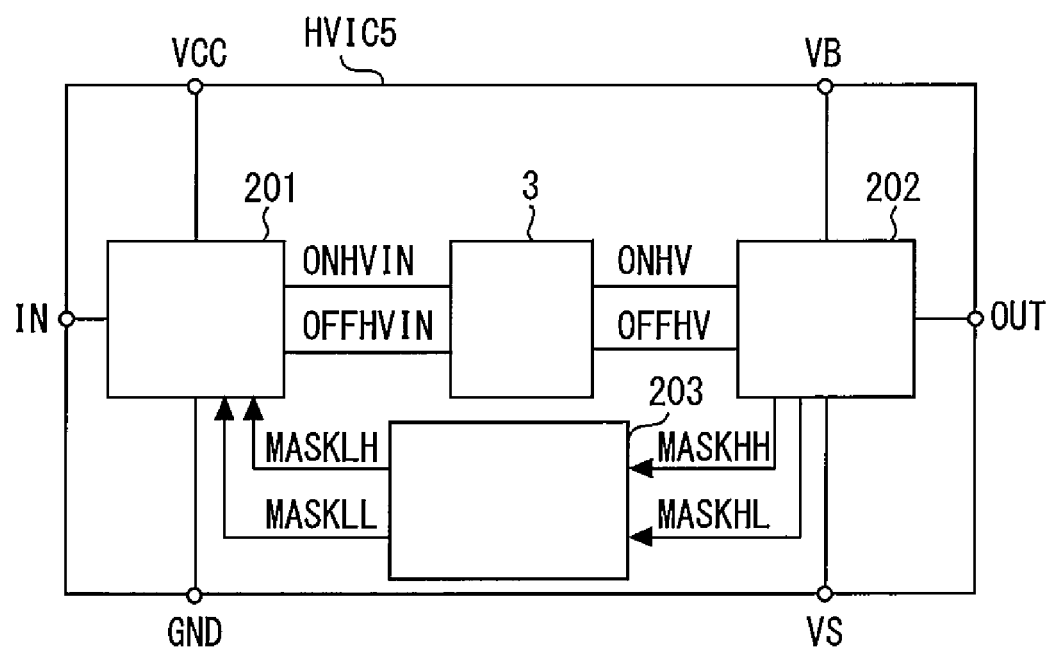
FIG. 41 is a circuit diagram showing a configuration of a drive circuit for a semiconductor device according to Embodiment 17 of the present invention.

FIG. 41 is a circuit diagram showing a configuration of a drive circuit HVIC5 for a semiconductor element according to Embodiment 17 of the present invention. The drive circuit HVIC5 for a semiconductor element according to Embodiment 17 is obtained by replacing the primary circuit 11 with a primary circuit 201, replacing the secondary circuit 122 with a secondary circuit 202 and replacing the signal transmission circuit 121 with a signal transmission circuit 203 in the drive circuit HVIC2 according to Embodiment 10.

Internal components of each circuit identical or corresponding to those in Embodiment 10 will be described by being assigned the same reference characters. The configuration will be described mainly with respect to points of difference from that of Embodiment 10, while the descriptions of commonalities, for example, in terms of circuit configuration and circuit operation are simplified or omitted.

In Embodiments 10 to 16, comparison signals MASKHL and MASKHH as a result of comparison between the mask signal MASKi and the output signal OUT may be produced and the re-operating signal MASKON or MASKOFF may be generated only when the states of the comparison signal MASKHL or MASKHH and input signal IN are different from each other. In the drive circuit HVIC5 according to Embodiment 17, such a circuit operation is realized.

Figure 42:
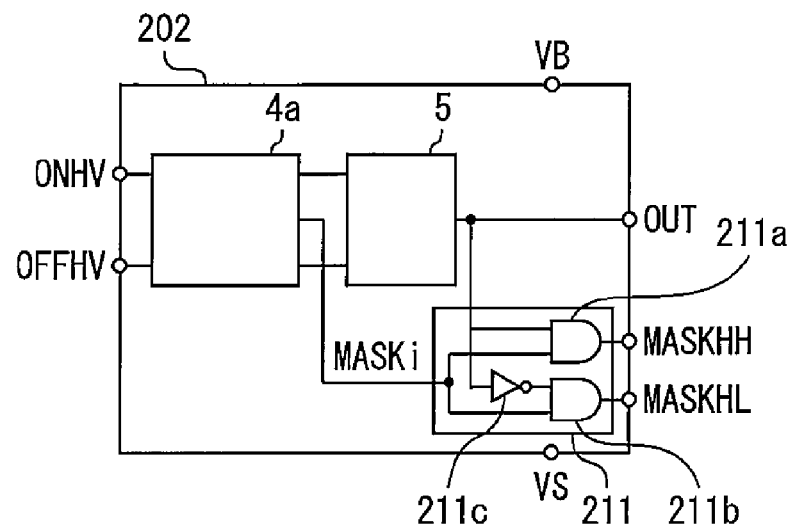
FIG. 42 is a circuit diagram showing a configuration of a drive circuit for a semiconductor device according to Embodiment 17 of the present invention.

FIG. 42 is a diagram showing internal components of the secondary circuit 202 according to Embodiment 17 of the present invention. The secondary circuit 202 includes a comparison logic circuit 211 for determination of the output signal OUT as well as the interlock circuit 4a and the drive circuit 5. The comparison logic circuit 211 computes logical products (AND). The comparison logic circuit 211 compares the mask signal MASKi and the output signal OUT and outputs the comparison signals MASKHH and MASKHL.

The comparison logic circuit 211 includes AND circuits 211a and 211b and a NOT circuit 211c. The AND circuit 211a receives as inputs the output OUT from the drive circuit 5 and the mask signal MASKi, computes the logical product and produces the comparison signal MASKHH as an output. The AND circuit 211b receives as inputs a signal formed by inverting the output OUT of the drive circuit 5 through the NOT circuit 211c and the mask signal MASKi. The AND circuit 211 computes the logical product of them and produces the comparison signal MASKHL as an output.

The comparison signal MASKHH rises only during a time period when a "high of the output signal OUT" and a "high of the mask signal MASKi" concur with each other. The comparison signal MASKHL rises only during a time period when a "high of the inverted signal formed by inverting the output signal OUT" and a "high of the mask signal MASKi" concur with each other.

As shown in FIG. 41, the signal transmission circuit 203 having received the comparison signals MASKHH and MASKHL outputs comparison signals MASKLH and MASKLL to the primary circuit 201. The signal transmission circuit 203 is a reverse level shift circuit for reversely level shifting the signals from the secondary circuit 202 to the primary circuit 201, as is the signal transmission circuit 121.

Figure 43:
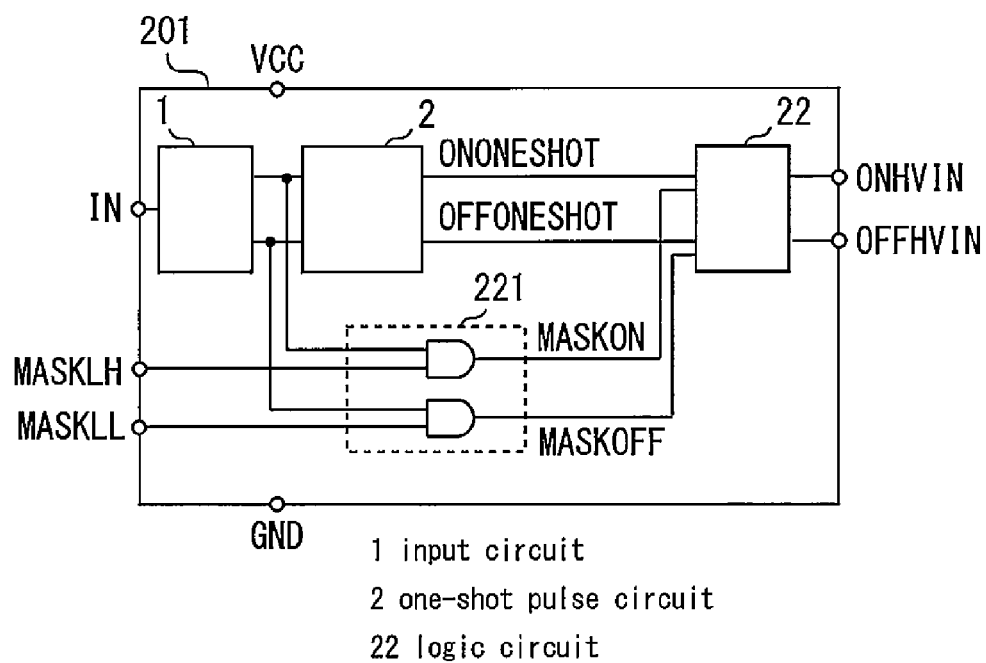
FIG. 43 is a circuit diagram showing a configuration of a drive circuit for a semiconductor device according to Embodiment 17 of the present invention.

FIG. 43 is a diagram showing internal components of the primary circuit 201. The primary circuit 201 includes a mask logic circuit 221 which receives the comparison signals MASKLH and MASKLL. The mask logic circuit 221 includes two AND circuits as shown in FIG. 43. The mask logic circuit 221 is similar to the logic circuit 21 but differs in that the signals input to the two AND circuits are independent of each other. The first AND circuit outputs the logical product of one of the outputs from the input circuit 1 and the comparison signal MASKLH. The second AND circuit outputs the logical product of the other output from the input circuit 1 and the comparison signal MASKLL. The primary circuit 201 thus makes comparisons between the input IN and the comparison signals MASKLH and MASKLL by the MASK logic circuit 221. The re-operating signal MASKON or MASKOFF is generated only when the states of, the input signal IN and the signal MASKLH or MASKLL are different from each other.

Figure 44:
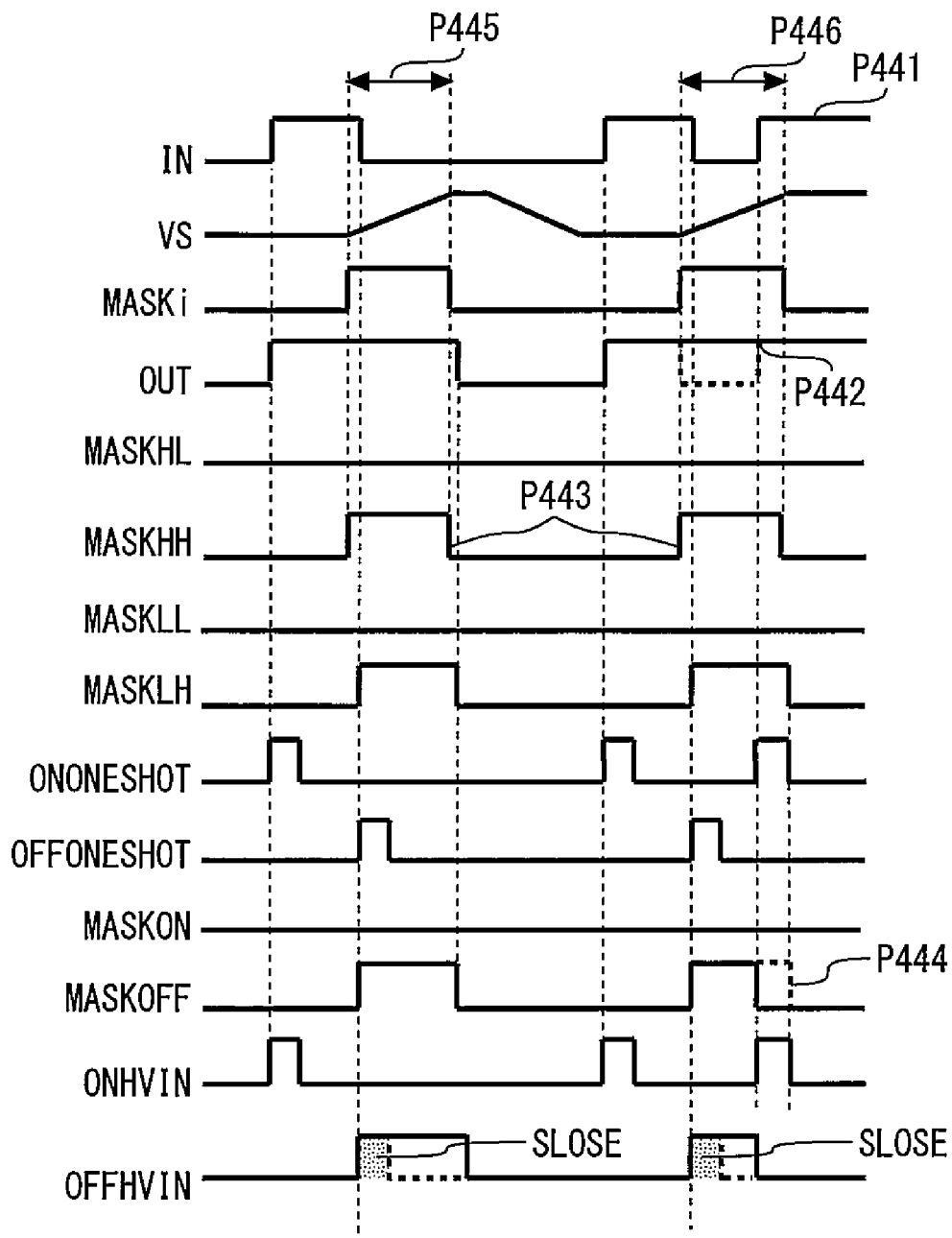
FIG. 44 is a time chart showing the operation of the drive circuit for a semiconductor element according to Embodiment 17 of the present invention.

FIG. 44 is a time chart showing the operation of the drive circuit for a semiconductor element according to Embodiment 17 of the present invention. The input signal IN is changed to high due to the generation of a pulse P441. Accordingly, the output signal OUT is also held high by a pulse P442.

A pulse P443 rises only during a time period when the output OUT and the mask signal MASKi concur with each other. That is, the pulse P443 becomes high only during a time period when both the output signal OUT and the mask signal MASKi are high.

Only an extracted portion of the output signal OUT concurring with the reference potential VS rise period is thereby output as a comparison signal MASKHH. This comparison signal MASKHH is reversely level shifted with some delay time while being transmitted through the signal transmission circuit 203, thus producing the comparison signal MASKLH.

That is, the mask signal MASKi is first produced according to a rise of the reference potential VS. The comparison signals MASKHL and MASKHH are produced by the logical operation on the mask signal MASKi and the output signal OUT. The comparison signals MASKLL and MASKLH are produced from the comparison signals MASKHL and MASKHH. A comparison between two time periods P445 and P446 in which the mask signal MASKi rises will be made. The states in these periods are the same till the production of the comparison signals MASKLL and MASKLH.

With respect to the time period P445, comparisons between the input signal IN and the comparison signals MASKLL and MASKLH are made. First, both the input signal IN and the comparison signal MASKLL are low. However, the states of the input signal IN and the comparison signal MASKLH are different from each other; the input signal IN is low, while the comparison signal MASKLH is high. As a result, the re-operating signal MASKOFF having the same pulse shape as that of the comparison signal MASKLH is produced in synchronization with the rising edge and the falling edge of the comparison signal MASKLH.

On the other hand, in the time period P446, the high/low states of the input signal IN and the mask signal MASKi before an intermediate point in time are the same as those in the time period P445. However, the pulse P441 rises from the intermediate point in the time period P446. Comparisons are made between the input signal IN and the comparison signals MASKLL and MASKLH when the pulse P441 rises. Both the input signal IN and the comparison signal MASKLH are high.

As a result, the re-operating signal MASKOFF produced during the time period P446 rises in synchronization with the rising edge of the comparison signal MASKLH but falls in synchronization with the rising edge of the pulse P441.

The re-operating signals MASKON and MASKOFF thus formed are combined with the one-shot pulses ONONESHOT and OFFONESHOT, respectively, in the logic circuit 22, thereby producing the pulse signals ONHVIN and OFFHVIN.

A pulse P444 indicated in a broken line disappears as a result of the interruption of the logic synthesis due to the change of the input signal IN to high by the pulse P441.

In Embodiment 17, an unnecessary operation of the high-voltage level shift circuit 3 can be prevented and the generation of heat from the high-voltage level shift circuit 3 can be suppressed.

Embodiment 18

Figure 45:
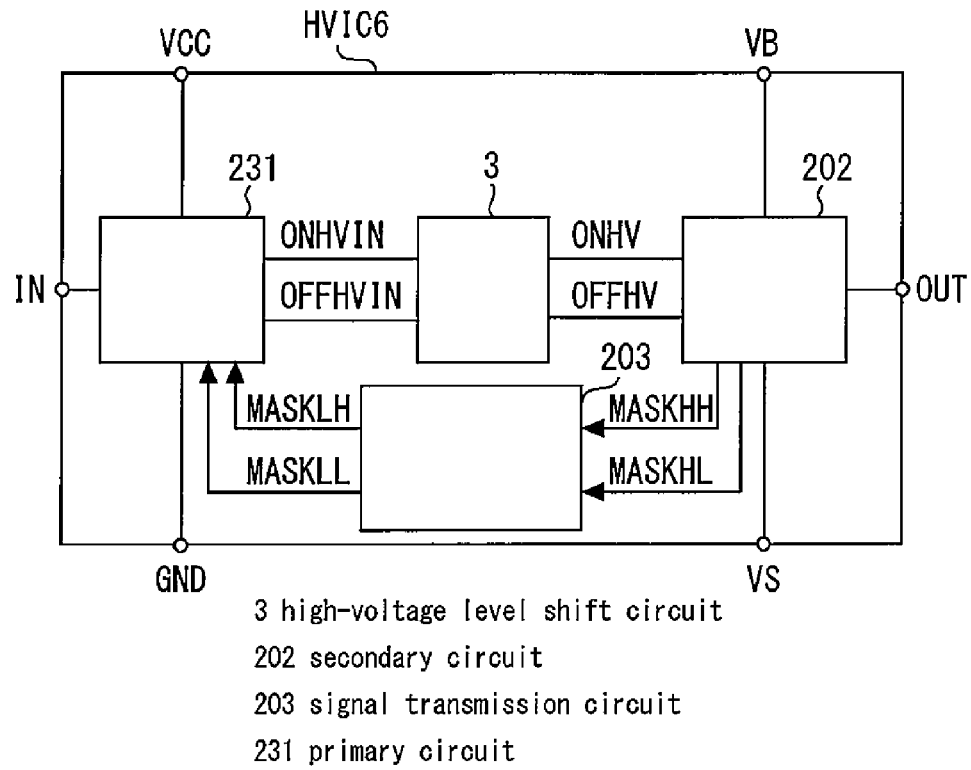
FIG. 45 is a circuit diagram showing a configuration of a drive circuit for a semiconductor element according to Embodiment 18 of the present invention.

FIG. 45 is a circuit diagram showing a configuration of a drive circuit HVIC6 for a semiconductor element according to Embodiment 18 of the present invention. The drive circuit HVIC6 for a semiconductor element according to Embodiment 18 is obtained by replacing the primary circuit 201 with a primary circuit 231 in the drive circuit HVIC5 according to Embodiment 17.

Internal components of each circuit identical or corresponding to those in Embodiment 17 will be described by being assigned the same reference characters. The configuration will be described mainly with respect to points of difference from that of Embodiment 18, while the descriptions of commonalities, for example, in terms of circuit configuration and circuit operation are simplified or omitted.

In Embodiment 17, in-phase portions of the signals MASKLL and MASKLH may be removed. In the drive circuit HVIC6 according to Embodiment 18, such a circuit operation is realized.

Figure 46:
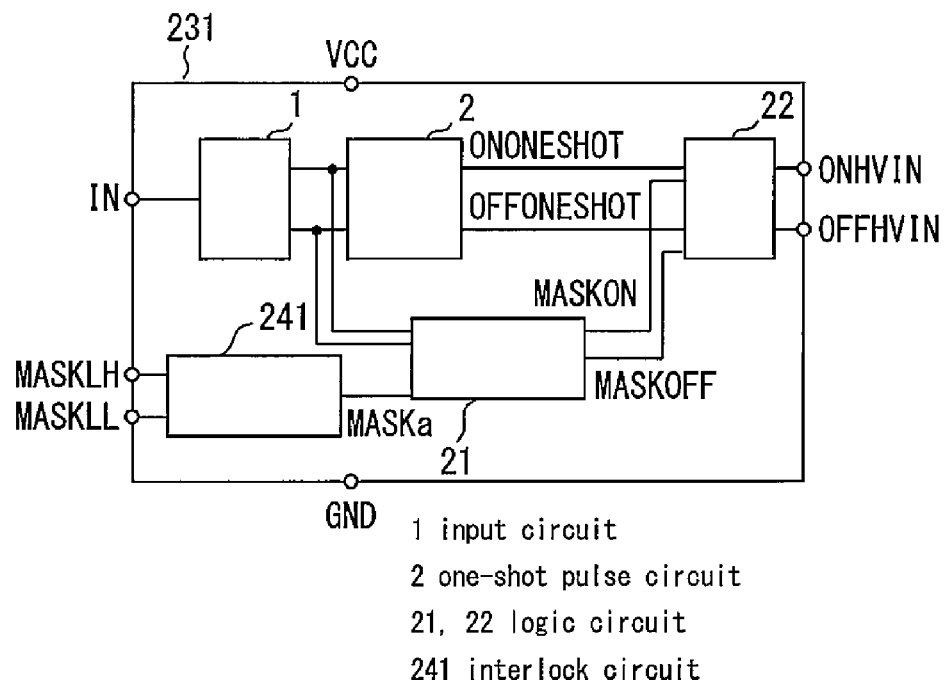
FIG. 46 is a circuit diagram showing a configuration of a drive circuit for a semiconductor element according to Embodiment 18 of the present invention.

FIG. 46 is a diagram showing internal components in the primary circuit 231 according to Embodiment 18 of the present invention. As shown in FIG. 46, the primary circuit 231 includes an interlock circuit 241 in a stage before the logic circuit 21.

This circuit configuration is the same as that of the primary circuit 127 according to Embodiment 11. In Embodiment 11, the interlock circuit 128 receives the mask signals MASKd and MASKL and outputs the mask signal MASKa. In Embodiment 18, the interlock circuit 241 receives the comparison signals MASKLH and MASKLL and outputs the mask signal MASKa.

Figure 47:
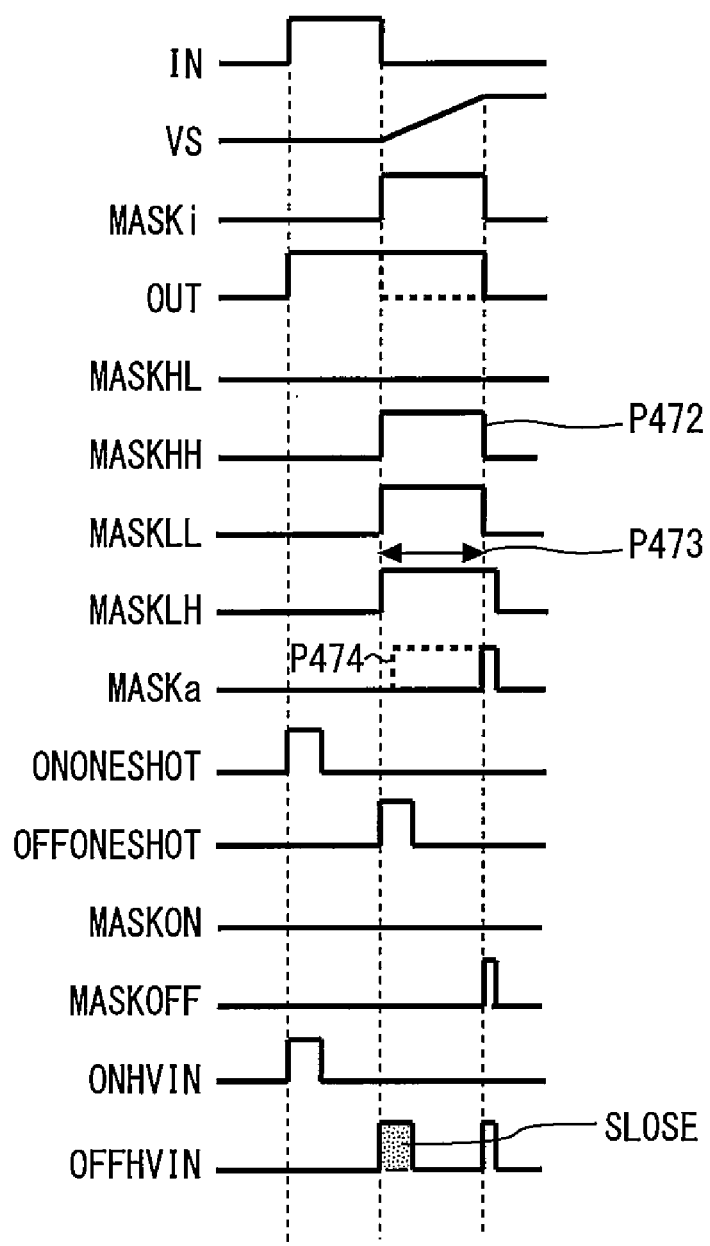
FIG. 47 is a time chart showing the operation of the drive circuit for a semiconductor element according to Embodiment 18 of the present invention.

FIG. 47 is a time chart showing the operation of the drive circuit HVIC6 for a semiconductor element according to Embodiment 18 of the present invention. A pulse P472 in the comparison signal MASKHH is an extract of the output signal OUT corresponding to a high portion of the mask signal MASKi, as in Embodiment 17.

The comparison signals MASKLL and MASKLH are both high and in phase with each other during a time period indicated by arrows P473. The interlock circuit 241 outputs the mask signal MASKa after removing the corresponding in-phase portion. A broken line P474 indicates the in-phase portion removed by the interlock circuit 241. The mask signal MASKa is thereafter input to the logic circuit 21 to realize the same operation as that in the primary circuit 127 according to Embodiment 11.

In FIG. 47, omission of delays caused between the comparison signals MASKHL and MASKHL and the comparison signals MASKLL and MASKLH, for example, is made for simplification of description.

The interlock circuit 241 removes in-phase portions of the comparison signals MASKHH and MASKLH to enable inhibition of an unnecessary operation of the high-voltage level shift circuit 3. The generation of heat from the high-voltage level shift circuit 3 can thereby be suppressed.

Embodiment 19

Figure 48:
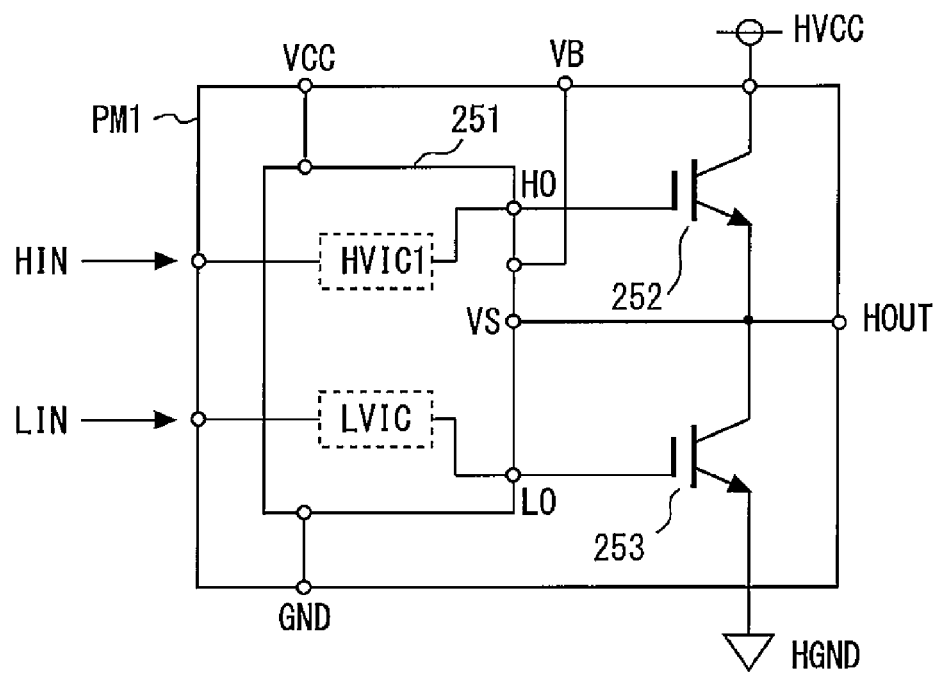
FIG. 48 is a circuit diagram showing a configuration of a semiconductor device according to Embodiment 19 of the present invention.

FIG. 48 is a circuit diagram showing a configuration of a semiconductor device PM1 according to Embodiment 19 of the present invention. The semiconductor device PM1 has the drive circuit HVIC1 according to the embodiment incorporated in a power semiconductor module.

As shown in FIG. 48, the semiconductor device PM1 incorporates a semiconductor device drive circuit 251 and semiconductor switching elements 252 and 253. Each of the semiconductor switching elements 252 and 253 is an insulated gate bipolar transistor (IGBT). These components form an arm circuit.

One end of the arm circuit is connected to a power supply HVCC, the other end of the arm circuit is connected to a ground potential HGND, and an intermediate point in the arm circuit is connected as output power HOUT to a load. A freewheel diode, not shown in FIG. 48, may be attached to each of the semiconductor switching elements 252 and 253.

The semiconductor device drive circuit 251 is a high-withstand-voltage IC for supplying drive signals to the gates of the semiconductor switching elements 252 and 253. The drive circuit HVIC1 according to Embodiment 1 is incorporated in the semiconductor device drive circuit 251. The drive circuit HVIC1 receives a high-side input signal HIN and outputs an output signal HO. This high-side output signal HO is supplied to the gate of the semiconductor switching element 252.

On the other hand, the semiconductor device drive circuit 251 also includes a low-withstand-voltage circuit LVIC. The low-withstand-voltage circuit LVIC receives a low-side input signal LIN and outputs an output signal LO. This low-side output signal LO is supplied to the gate of the semiconductor switching element 253.

The power supply VCC and the power supply VB for the semiconductor device drive circuit 251 are supplied from the outside of the semiconductor device PM1. The first reference potential GND is connected to the outside of the semiconductor device PM1. The second reference potential VS is connected to a point of connection between the emitter of the semiconductor switching element 252 and the collector of the semiconductor switching element 253, i.e., the intermediate point in the arm circuit.

While the power supply VB for the semiconductor device PM1 is supplied from the outside of the semiconductor device PM1, it may alternatively be generated in the semiconductor device PM1. As a technique relating to such power supply generation, various techniques using, for example, a bootstrap circuit including a bootstrap diode are well-known. Such a technique is not a new matter. Any of the well-known techniques may be used. Therefore, the technique to be used will not be described in detail in this description.

In such a circuit, the semiconductor switching element 253 is turned on to connect the reference potential VS to the HGND side, and the switching element 252 is thereafter turned on. Then, the reference potential VS rises. In relation to this, the semiconductor device PM1 according to Embodiment 19 has the drive circuit HVIC1 according to Embodiment 1. Therefore, a power semiconductor module capable of preventing the malfunction due to the rise (change dV/dt) of the reference potential VS and having high reliability can be provided.

The semiconductor device PM1 according to Embodiment 19 incorporates the drive circuit HVIC1, but the present invention is not limited to this. In the semiconductor device PM1, the drive circuit HVIC1 may be replaced with one of the drive circuit for semiconductor elements according to Embodiments 2 to 18.

Embodiment 20

Figure 49:
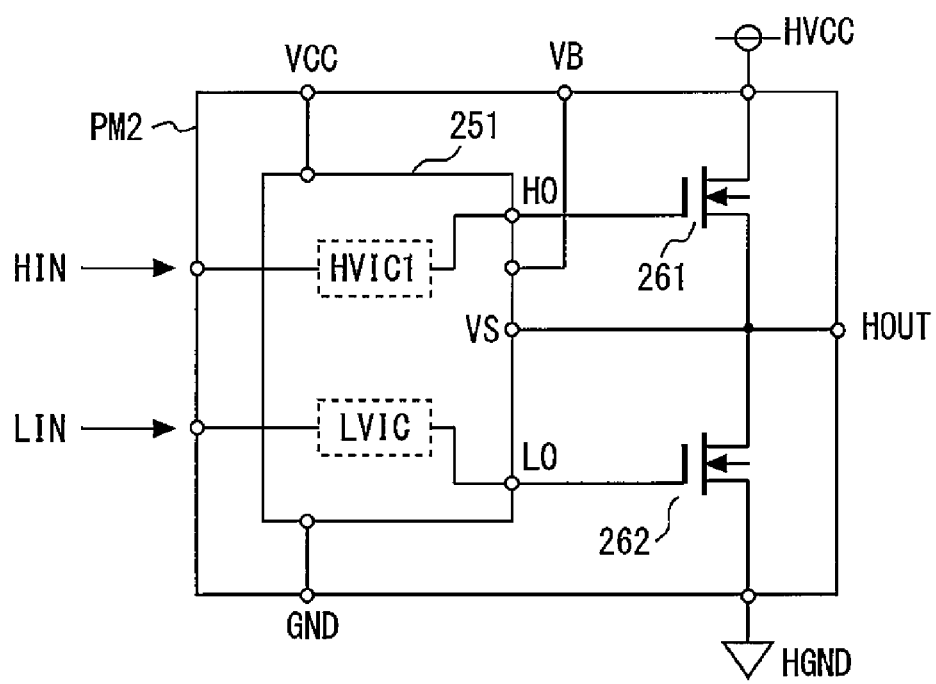
FIG. 49 is a circuit diagram showing a configuration of a semiconductor device according to Embodiment 20 of the present invention.

FIG. 49 is a circuit diagram showing a configuration of a semiconductor device PM2 according to Embodiment 20 of the present invention. The semiconductor device PM2 includes the drive circuit HVIC1 for a semiconductor element according to Embodiment 1 described above. The semiconductor device PM2 has the same configuration as that of the semiconductor device PM1 according to Embodiment 19 except that semiconductor switching elements 261 and 262 are provided in place of the semiconductor switching elements 252 and 253.

The semiconductor switching elements 261 and 262 are power MOSFETs using SiC as a semiconductor material. Use of the SiC device enables the semiconductor device PM2 to be reduced in size.

That is, as semiconductor switching elements, Si power semiconductor elements, SiC power semiconductor elements or power semiconductor elements using any of various compound semiconductor materials other than Si may be used. The power switching elements may be formed of a wide-bandgap semiconductor having a bandgap larger than that of silicon. The wide-bandgap semiconductor is, for example, silicon carbide (SiC), a gallium nitride-based material or diamond.

Switching elements or diode elements formed of such a wide-bandgap semiconductor have a high withstand voltage and a high allowable current density and can therefore be reduced in size. Use of such switching elements or diode elements reduced in size enables a semiconductor module incorporating the elements to be reduced in size.

Such elements also have high heat resistance. Therefore, heat-dissipating fins of a heat sink for such element can be reduced in size or a water cooling portion of a heat sink can be modified into an air cooling portion. As a result, a semiconductor module including such components can be further reduced in size. Also, since the power loss is low, an improvement in efficiency of the switching elements or diode elements and, hence, an improvement in efficiency of the semiconductor module can also be achieved. If an SiC device is used, these advantages can be obtained.

The semiconductor device PM2 according to Embodiment 20 incorporates the drive circuit HVIC1, but the present invention is not limited to this. In the semiconductor device PM2, the drive circuit HVIC1 may be replaced with one of the drive circuit for semiconductor elements according to Embodiments 2 to 18.

The concrete examples of the circuits in the embodiments described above, e.g., the logic gates or the like for the logic circuits in particular have been concretely disclosed. However, the present invention is not limited to the circuits in the above-described embodiments. Any logic circuits capable of similar logical operations also suffice, and circuits different from those in the embodiments may be used. Other various modifications may be made and different circuits may be used without departing from the gist of the present invention.

REFERENCE SIGNS LIST

1 input circuit, 2 one-shot pulse circuit, 3 high-voltage level shift circuit, 4, 4a interlock circuit, 5 drive circuit, 6, 11 primary circuit, 7 secondary circuit, 12 dV/dt detection circuit, 21, 22 logic circuit, 252, 253 semiconductor switching element, HVIC0, HVIC1, HVIC2, HVIC3, HVIC4, HVIC5, HVIC6 drive circuit, PM1, PM2 semiconductor device.

The invention claimed is:

1. A drive circuit for a semiconductor element, comprising:
    a primary circuit which receives an input signal and produces, on the basis of a first reference potential, a first on-pulse synchronized with a rising edge of the input signal and a first off-pulse synchronized with a falling edge of the input signal;
    a level shift circuit which produces, on the basis of a second reference potential different from the first reference potential, a second on-pulse formed by shifting the voltage level of the first on-pulse and a second off-pulse formed by shifting the voltage level of the first off-pulse;
    a secondary circuit which outputs, as a drive signal for the semiconductor element, an output pulse rising in synchronization with the second on-pulse and falling in synchronization with the second off-pulse, and which holds the output when both the second on-pulse and the second off-pulse are high; and
    a mask signal production circuit which produces a mask signal which is a pulse signal changing between a high and a low in synchronization with the beginning and the end of the rise of the second reference potential,
    wherein a re-operating signal according to the state of the input signal during the rise of the second reference potential is generated by the mask signal to generate the first on-pulse or the first off-pulse having a falling edge delayed relative to the mask signal, and one of the second on-pulse and the second off-pulse is thereby made high after the end of the rise of the second reference potential to retransmit the state of the input signal.

2. The drive circuit for a semiconductor element according to claim 1, wherein the mask signal generation circuit includes a voltage detection circuit which outputs a pulse which becomes high during a potential rise in the level shift circuit, and
    wherein the pulse output from the voltage detection circuit is the mask signal.

3. The drive circuit for a semiconductor element according to claim 1, wherein the primary circuit includes:
    a one-shot pulse circuit which receives the input signal and produces an on-one-shot pulse synchronized with the rising edge of the input signal and an off-one-shot pulse synchronized with the falling edge of the input signal; and
    a logic circuit which logically adds selectively to the on-one-shot pulse or the off-one-shot pulse the re-operating signal corresponding to the state of the input signal during the rise of the second reference potential, and
    wherein the primary circuit outputs, as the first on-pulse and the first off-pulse, respectively, the on-one-shot pulse and the off-one-shot pulse obtained after the selective logical addition performed by means of the logical circuit.

4. The drive circuit for a semiconductor element according to claim 3, wherein the re-operating signal is produced only when one of the on-one-shot pulse and the off-one-shot pulse overlaps the mask signal.

5. The drive circuit for a semiconductor element according to claim 4, wherein the re-operating signal is produced only when the mask signal fully overlaps the on-one-shot pulse or the off-one-shot pulse.

6. The drive circuit for a semiconductor element according to claim 1, further comprising a delay circuit which is connected to the mask signal production circuit, and which outputs a signal formed by delaying the mask signal,
    wherein the re-operating signal is produced by using the output from the delay circuit.

7. The drive circuit for a semiconductor element according to claim 1, wherein the re-operating signal is produced only when the pulse width of the mask signal is equal to or larger than a predetermined width.

8. The drive circuit for a semiconductor element according to claim 1, further comprising a one-shot-pulse signal production circuit which receives the mask signal as an input and produces a one-shot re-operating signal which falls after a falling edge of the mask signal, wherein the one-shot re-operating signal is the re-operating signal.

9. The drive circuit for a semiconductor element according to claim 8, wherein the one-shot re-operating signal is a pulse having a width larger than the width of the mask signal.

10. The drive circuit for a semiconductor element according to claim 8, wherein the one-shot re-operating signal is produced in synchronization with the falling edge of the mask signal.

11. The drive circuit for a semiconductor element according claim 1, wherein the primary circuit includes a one-shot pulse circuit which receives an input pulse formed of a logical synthesis of the input signal and the mask signal, and produces a one-shot pulse synchronized with the falling edge of the input pulse.

12. The drive circuit for a semiconductor element according to claim 1, wherein the mask signal production circuit includes an interlock circuit which is provided in the secondary circuit, and which outputs a pulse which is high during a time period when both the second on-pulse and the second off-pulse are high, and
wherein the pulse output from the interlock circuit is the mask signal.

13. The drive circuit for a semiconductor element according to claim 1, further comprising:
a voltage detection circuit which produces a first mask signal which is a pulse signal having a width equal to the time period during which the second reference potential rises; and
an interlock circuit which is provided in the secondary circuit, produces a pulse which is high during a time period when both the second on-pulse and the second off-pulse are high, and outputs a second mask signal formed by delaying the pulse,
wherein portions of the first mask signal and the second mask signal not concurring with each other are the re-operating signal.

14. The drive circuit for a semiconductor element according to claim 1, wherein the production of the re-operating signal is interrupted when the input signal is changed at an intermediate point in a pulse waveform of the mask signal.

15. The drive circuit for a semiconductor element according to claim 1, further comprising:
a comparison logic circuit which produces a first concurrent mask signal formed of concurrent portions of pulse waveforms of the mask signal and the output signal from the secondary circuit;
a signal transmission circuit which receives the first concurrent mask signal from the comparison logic circuit and transmits the signal to a subsequent stage; and
a mask logic circuit which receives a second concurrent mask signal according to the first concurrent mask signal from the signal transmission circuit, selectively produces the re-operating signal according to concurrences of a high and a low between the second concurrent mask signal and the input signal, and interrupts the production of the re-operating signal when the input signal is changed at an intermediate point in a pulse waveform of the mask signal.

16. The drive circuit for a semiconductor element according to claim 15, wherein when two of the second concurrent mask signal are simultaneously produced from the signal transmission circuit by a cause other than the first concurrent mask signal, and when the second concurrent mask signal has concurrent portions, the concurrent portions are removed from the second concurrent mask signal.

* * * * *